(12) United States Patent
Gally et al.

(10) Patent No.: US 7,405,924 B2
(45) Date of Patent: Jul. 29, 2008

(54) SYSTEM AND METHOD FOR PROTECTING MICROELECTROMECHANICAL SYSTEMS ARRAY USING STRUCTURALLY REINFORCED BACK-PLATE

(75) Inventors: Brian Gally, San Rafael, CA (US); Lauren Palmateer, San Francisco, CA (US); William J. Cummings, San Francisco, CA (US)

(73) Assignee: IDC, LLC, San Francisco, CA (US)

( * ) Notice: Subject to any disclaimer, the term of this patent is extended or adjusted under 35 U.S.C. 154(b) by 396 days.

(21) Appl. No.: 11/090,774

(22) Filed: Mar. 25, 2005

(65) Prior Publication Data

US 2006/0076648 A1  Apr. 13, 2006

Related U.S. Application Data

(60) Provisional application No. 60/613,408, filed on Sep. 27, 2004.

(51) Int. Cl.
*H05K 5/00* (2006.01)
*H01L 23/10* (2006.01)

(52) U.S. Cl. .................................. 361/679; 257/678
(58) Field of Classification Search ............... 257/678; 438/106; 361/679
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,653,741 A | 4/1972 | Marks |
| 3,656,836 A | 4/1972 | de Cremoux et al. |
| 3,813,265 A | 5/1974 | Marks |
| 3,955,880 A | 5/1976 | Lierke |
| 4,036,360 A | 7/1977 | Deffeyes |
| 4,074,480 A | 2/1978 | Burton |
| 4,099,854 A | 7/1978 | Decker et al. |
| 4,228,437 A | 10/1980 | Shelton |
| 4,310,220 A | 1/1982 | Kuwagaki et al. |
| 4,377,324 A | 3/1983 | Durand et al. |

(Continued)

FOREIGN PATENT DOCUMENTS

EP    0 667 548    8/1995

(Continued)

OTHER PUBLICATIONS

Akasaka, "Three-Dimensional IC Trends", Proceedings of IEEE, vol. 74, No. 12, pp. 1703-1714, (Dec. 1986).

(Continued)

*Primary Examiner*—Evan Pert
(74) *Attorney, Agent, or Firm*—Knobbe Martens Olson & Bear LLP

(57) ABSTRACT

Disclosed is an electronic device utilizing interferometric modulation and a package of the device. The packaged device includes a substrate, an interferometric modulation display array formed on the substrate, and a back-plate. The back-plate is placed over the display array with a gap between the back-plate and the display array. The device further includes reinforcing structures which are integrated with the back-plate. The reinforcing structures add stiffness to the back-plate. The back-plate may have a thickness varying along an edge thereof.

30 Claims, 17 Drawing Sheets

U.S. PATENT DOCUMENTS

| | | |
|---|---|---|
| 4,389,096 A | 6/1983 | Hori et al. |
| 4,403,248 A | 9/1983 | te Velde |
| 4,431,691 A | 2/1984 | Greenlee |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,954,789 A | 9/1990 | Sampsell |
| 4,956,619 A | 9/1990 | Hornbeck |
| 4,977,009 A | 12/1990 | Anderson et al. |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,244,707 A | 9/1993 | Shores |
| 5,254,980 A | 10/1993 | Hendrix et al. |
| 5,268,533 A | 12/1993 | Kovacs et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,304,419 A | 4/1994 | Shores |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,325,116 A | 6/1994 | Sampsell |
| 5,327,286 A | 7/1994 | Sampsell et al. |
| 5,331,454 A | 7/1994 | Hornbeck |
| 5,339,116 A | 8/1994 | Urbanus et al. |
| 5,365,283 A | 11/1994 | Doherty et al. |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,591,379 A | 1/1997 | Shores |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,636,052 A | 6/1997 | Arney et al. |
| 5,646,768 A | 7/1997 | Kaeiyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,703,710 A | 12/1997 | Brinkman et al. |
| 5,710,656 A | 1/1998 | Goosen |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,784,189 A | 7/1998 | Bozler et al. |
| 5,784,190 A | 7/1998 | Worley |
| 5,784,212 A | 7/1998 | Hornbeck |
| 5,815,141 A | 9/1998 | Phares |
| 5,818,095 A | 10/1998 | Sampsell |
| 5,825,528 A | 10/1998 | Goosen |

| | | | | | | |
|---|---|---|---|---|---|---|
| 5,835,255 | A | 11/1998 | Miles | 6,779,260 B1 | 8/2004 | Brandenburg et al. |
| 5,842,088 | A | 11/1998 | Thompson | 6,794,119 B2 | 9/2004 | Miles |
| 5,853,662 | A | 12/1998 | Watanabe | 6,811,267 B1 | 11/2004 | Allen et al. |
| 5,856,820 | A | 1/1999 | Weigers et al. | 6,819,469 B1 | 11/2004 | Koba |
| 5,912,758 | A | 6/1999 | Knipe et al. | 6,822,628 B2 | 11/2004 | Dunphy et al. |
| 5,939,785 | A | 8/1999 | Klonis et al. | 6,829,132 B2 | 12/2004 | Martin et al. |
| 5,959,763 | A | 9/1999 | Bozler et al. | 6,843,936 B1 | 1/2005 | Jacobs |
| 5,986,796 | A | 11/1999 | Miles | 6,853,129 B1 | 2/2005 | Cummings et al. |
| 6,028,690 | A | 2/2000 | Carter et al. | 6,855,610 B2 | 2/2005 | Tung et al. |
| 6,038,056 | A | 3/2000 | Florence et al. | 6,859,218 B1 | 2/2005 | Luman et al. |
| 6,040,937 | A | 3/2000 | Miles | 6,861,277 B1 | 3/2005 | Monroe et al. |
| 6,049,317 | A | 4/2000 | Thompson et al. | 6,862,022 B2 | 3/2005 | Slupe |
| 6,055,090 | A | 4/2000 | Miles | 6,862,029 B1 | 3/2005 | D'Souza et al. |
| 6,061,075 | A | 5/2000 | Nelson et al. | 6,867,896 B2 | 3/2005 | Miles |
| 6,099,132 | A | 8/2000 | Kaeriyama | 6,870,581 B2 | 3/2005 | Li et al. |
| 6,107,115 | A | 8/2000 | Atobe et al. | 6,882,458 B2 | 4/2005 | Lin et al. |
| 6,113,239 | A | 9/2000 | Sampsell et al. | 6,882,480 B2 | 4/2005 | Yanagisawa |
| 6,120,339 | A | 9/2000 | Alwan | 6,947,200 B2 | 9/2005 | Huibers |
| 6,147,790 | A | 11/2000 | Meier et al. | 6,995,890 B2 | 2/2006 | Lin |
| 6,160,833 | A | 12/2000 | Floyd et al. | 6,999,225 B2 | 2/2006 | Lin et al. |
| 6,180,428 | B1 | 1/2001 | Peeters et al. | 7,015,885 B2 | 3/2006 | Novotny et al. |
| 6,195,196 | B1 | 2/2001 | Kimura et al. | 7,034,984 B2 | 4/2006 | Pan et al. |
| 6,201,633 | B1 | 3/2001 | Peeters et al. | 7,060,895 B2 | 6/2006 | Kothari et al. |
| 6,232,936 | B1 | 5/2001 | Gove et al. | 7,123,216 B1 | 10/2006 | Miles |
| 6,238,755 | B1 | 5/2001 | Harvey et al. | 7,126,741 B2 | 10/2006 | Wagner et al. |
| 6,282,010 | B1 | 8/2001 | Sulzbach et al. | 7,161,728 B2 | 1/2007 | Sampsell et al. |
| 6,295,154 | B1 | 9/2001 | Laor et al. | 7,164,520 B2 | 1/2007 | Palmateer et al. |
| 6,303,986 | B1 | 10/2001 | Shook | 7,259,449 B2 * | 8/2007 | Floyd .................... 257/678 |
| 6,323,982 | B1 | 11/2001 | Hornbeck | 7,282,393 B2 * | 10/2007 | Tarn ...................... 438/116 |
| 6,365,229 | B1 | 4/2002 | Robbins | 2001/0003487 A1 | 6/2001 | Miles |
| 6,379,988 | B1 | 4/2002 | Peterson et al. | 2001/0055146 A1 | 12/2001 | Atobe et al. |
| 6,426,461 | B1 | 7/2002 | Ginter et al. | 2002/0015215 A1 | 2/2002 | Miles |
| 6,447,126 | B1 | 9/2002 | Hornbeck | 2002/0043706 A1 | 4/2002 | Jerominek et al. |
| 6,455,927 | B1 | 9/2002 | Glenn et al. | 2002/0056900 A1 | 5/2002 | Liu et al. |
| 6,462,392 | B1 | 10/2002 | Pinter et al. | 2002/0070931 A1 | 6/2002 | Ishikawa |
| 6,465,355 | B1 | 10/2002 | Horsley | 2002/0075551 A1 | 6/2002 | Daneman |
| 6,466,354 | B1 | 10/2002 | Gudeman | 2002/0075555 A1 | 6/2002 | Miles |
| 6,466,358 | B2 | 10/2002 | Tew | 2002/0126364 A1 | 9/2002 | Miles |
| 6,473,274 | B1 | 10/2002 | Maimone et al. | 2002/0160583 A1 | 10/2002 | Song |
| 6,480,177 | B2 | 11/2002 | Doherty et al. | 2002/0187254 A1 | 12/2002 | Ghosh |
| 6,489,670 | B1 | 12/2002 | Peterson et al. | 2003/0043157 A1 | 3/2003 | Miles |
| 6,495,895 | B1 | 12/2002 | Peterson et al. | 2003/0054588 A1 | 3/2003 | Patel |
| 6,496,122 | B2 | 12/2002 | Sampsell | 2003/0062186 A1 | 4/2003 | Boroson et al. |
| 6,525,416 | B2 | 2/2003 | Hauser et al. | 2003/0072070 A1 | 4/2003 | Miles |
| 6,538,312 | B1 | 3/2003 | Peterson et al. | 2003/0075794 A1 | 4/2003 | Felton et al. |
| 6,545,335 | B1 | 4/2003 | Chua et al. | 2003/0108306 A1 | 6/2003 | Whitney et al. |
| 6,548,908 | B2 | 4/2003 | Chua et al. | 2003/0144034 A1 | 7/2003 | Hack et al. |
| 6,549,338 | B1 | 4/2003 | Wolverton et al. | 2003/0152872 A1 | 8/2003 | Miles |
| 6,552,840 | B2 | 4/2003 | Knipe | 2003/0183916 A1 | 10/2003 | Heck et al. |
| 6,558,820 | B2 | 5/2003 | Raychaudhuri et al. | 2003/0184412 A1 | 10/2003 | Gorrell |
| 6,574,033 | B1 | 6/2003 | Chui et al. | 2003/0202264 A1 | 10/2003 | Weber et al. |
| 6,589,625 | B1 | 7/2003 | Kothari et al. | 2003/0202265 A1 | 10/2003 | Reboa et al. |
| 6,600,201 | B2 | 7/2003 | Hartwell et al. | 2003/0202266 A1 | 10/2003 | Ring et al. |
| 6,603,182 | B1 | 8/2003 | Low et al. | 2004/0051929 A1 | 3/2004 | Sampsell et al. |
| 6,606,175 | B1 | 8/2003 | Sampsell et al. | 2004/0058532 A1 | 3/2004 | Miles et al. |
| 6,625,047 | B2 | 9/2003 | Coleman, Jr. | 2004/0061492 A1 | 4/2004 | Lopes et al. |
| 6,630,786 | B2 | 10/2003 | Cummings et al. | 2004/0076008 A1 | 4/2004 | Ikeda |
| 6,632,698 | B2 | 10/2003 | Ives | 2004/0080807 A1 | 4/2004 | Chen et al. |
| 6,643,069 | B2 | 11/2003 | Dewald | 2004/0100677 A1 | 5/2004 | Huibers et al. |
| 6,650,455 | B2 | 11/2003 | Miles | 2004/0140557 A1 | 7/2004 | Sun et al. |
| 6,661,084 | B1 | 12/2003 | Peterson et al. | 2004/0145049 A1 | 7/2004 | McKinnell et al. |
| 6,666,561 | B1 | 12/2003 | Blakley | 2004/0147056 A1 | 7/2004 | McKinnell et al. |
| 6,674,159 | B1 | 1/2004 | Peterson et al. | 2004/0160143 A1 | 8/2004 | Shreeve et al. |
| 6,674,562 | B1 | 1/2004 | Miles | 2004/0163472 A1 | 8/2004 | Nagahara |
| 6,680,792 | B2 | 1/2004 | Miles | 2004/0173886 A1 | 9/2004 | Carley |
| 6,690,444 | B1 | 2/2004 | Wilkinson et al. | 2004/0174583 A1 | 9/2004 | Chen et al. |
| 6,710,908 | B2 | 3/2004 | Miles et al. | 2004/0179281 A1 | 9/2004 | Reboa |
| 6,741,377 | B2 | 5/2004 | Miles | 2004/0183990 A1 | 9/2004 | Guang et al. |
| 6,741,384 | B1 | 5/2004 | Martin et al. | 2004/0184133 A1 | 9/2004 | Su et al. |
| 6,741,503 | B1 | 5/2004 | Farris et al. | 2004/0212026 A1 | 10/2004 | Van Brocklin et al. |
| 6,747,785 | B2 | 6/2004 | Chen et al. | 2004/0217378 A1 | 11/2004 | Martin et al. |
| 6,775,174 | B2 | 8/2004 | Huffman et al. | 2004/0217919 A1 | 11/2004 | Pichl et al. |
| 6,778,155 | B2 | 8/2004 | Doherty et al. | 2004/0218251 A1 | 11/2004 | Piehl et al. |

| | | | |
|---|---|---|---|
| 2004/0218334 | A1 | 11/2004 | Martin et al. |
| 2004/0218341 | A1 | 11/2004 | Martin et al. |
| 2004/0227493 | A1 | 11/2004 | Van Brocklin et al. |
| 2004/0240032 | A1 | 12/2004 | Miles |
| 2004/0240138 | A1 | 12/2004 | Martin et al. |
| 2004/0245588 | A1 | 12/2004 | Nikkel et al. |
| 2004/0263944 | A1 | 12/2004 | Miles et al. |
| 2005/0001828 | A1 | 1/2005 | Martin et al. |
| 2005/0035699 | A1 | 2/2005 | Tsai |
| 2005/0036095 | A1 | 2/2005 | Yeh et al. |
| 2005/0036192 | A1 | 2/2005 | Lin et al. |
| 2005/0038950 | A1 | 2/2005 | Adelmann |
| 2005/0042117 | A1 | 2/2005 | Lin |
| 2005/0046919 | A1 | 3/2005 | Taguchi et al. |
| 2005/0057442 | A1 | 3/2005 | Way |
| 2005/0068583 | A1 | 3/2005 | Gutkowski et al. |
| 2005/0069209 | A1 | 3/2005 | Damera-Venkata et al. |
| 2005/0074919 | A1 | 4/2005 | Patel et al. |
| 2005/0093134 | A1 | 5/2005 | Tarn |
| 2005/0184304 | A1 | 8/2005 | Gupta et al. |
| 2005/0195462 | A1 | 9/2005 | Lin |
| 2005/0253283 | A1 | 11/2005 | DCamp |
| 2005/0254115 | A1* | 11/2005 | Palmateer et al. ............ 359/276 |
| 2005/0254982 | A1 | 11/2005 | Cadeddu |
| 2006/0029732 | A1 | 2/2006 | Kobrin et al. |
| 2006/0065436 | A1* | 3/2006 | Gally et al. ................ 174/260 |
| 2006/0066600 | A1* | 3/2006 | Palmateer ................... 345/204 |
| 2006/0066935 | A1 | 3/2006 | Cummings et al. |
| 2006/0067642 | A1* | 3/2006 | Tyger ......................... 385/147 |
| 2006/0076631 | A1* | 4/2006 | Palmateer et al. ........... 257/414 |
| 2006/0076632 | A1* | 4/2006 | Palmateer et al. ........... 257/414 |
| 2006/0076634 | A1* | 4/2006 | Palmateer et al. ........... 257/415 |
| 2006/0076637 | A1* | 4/2006 | Gally et al. ................. 257/433 |
| 2006/0077126 | A1* | 4/2006 | Kothari ...................... 345/33 |
| 2006/0077146 | A1* | 4/2006 | Palmateer .................... 345/85 |
| 2006/0077147 | A1* | 4/2006 | Palmateer et al. ............ 345/85 |
| 2006/0077150 | A1* | 4/2006 | Sampsell ..................... 345/85 |
| 2006/0077503 | A1* | 4/2006 | Palmateer et al. ........... 359/237 |
| 2006/0077524 | A1* | 4/2006 | Palmateer ................... 359/291 |
| 2006/0077533 | A1* | 4/2006 | Miles et al. ................. 359/321 |
| 2006/0148365 | A1 | 7/2006 | Tsai |
| 2006/0274400 | A1 | 12/2006 | Miles |
| 2007/0170568 | A1* | 7/2007 | Palmateer et al. ........... 257/680 |

FOREIGN PATENT DOCUMENTS

| | | |
|---|---|---|
| EP | 0 822 570 | 2/1998 |
| EP | 1418154 A2 | 5/2004 |
| JP | 02-068513 | 3/1990 |
| JP | 03-199920 | 8/1991 |
| JP | 2001-318324 | 11/2001 |
| JP | 2002-062491 | 2/2002 |
| JP | 2002-328313 | 11/2002 |
| JP | 2003-233024 | 8/2003 |
| WO | WO 95/01624 | 1/1995 |
| WO | WO9530924 | 11/1995 |
| WO | WO9717628 | 5/1997 |
| WO | WO 99/41732 | 8/1999 |
| WO | WO9952006 A2 | 10/1999 |
| WO | WO9952006 A3 | 10/1999 |
| WO | WO 01/58804 | 8/2001 |
| WO | WO 02/42716 A2 | 5/2002 |
| WO | WO03007049 A1 | 1/2003 |
| WO | WO 03/026369 | 3/2003 |
| WO | WO 03/054925 | 3/2003 |
| WO | WO03069413 A1 | 8/2003 |
| WO | WO03073151 A1 | 9/2003 |
| WO | WO 03/084861 | 10/2003 |
| WO | WO2004006003 A1 | 1/2004 |
| WO | WO2004026757 A2 | 4/2004 |
| WO | WO 2005/066596 | 7/2005 |
| WO | WO 2005/110914 | 11/2005 |
| WO | WO 2005/114294 | 12/2005 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K., et al., "Surface micromachined tuneable interferometer array," Sensors and Actuators, pp. 17-23. (1994).

Conner, "Hybrid Color Display Using Optical Interference Filter Array," SID Digest, pp. 577-580 (1993).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119-1121 (Sep. 1994).

Gosch, "West Germany Grabs the Lead in X-Ray Lithography," Electronics pp. 78-80 (Feb. 5, 1987).

Howard et al., "Nanometer-Scale Fabrication Techniques", VLSI Electronics: Microstructure Science, vol. 5, pp. 145-153 and pp. 166-173 (1982).

Jackson "Classical Electrodynamics", John Wiley & Sons Inc., pp. 568-573, date unknown.

Jerman et al., "A Miniature Fabry-Perot Interferometer with a Corrugated Silicon Diaphragm Support", (1988).

Johnson "Optical Scanners", Microwave Scanning Antennas, vol. 1, p. 251-261, (1964).

Light over Matter, Circle No. 36 (Jun. 1993).

Miles, Mark, W., "A New Reflective FPD Technology Using Interferometric Modulation", The Proceedings of the Society for Information Display (May 11-16, 1997).

Newsbreaks, "Quantum-trench devices might operate at terahertz frequencies", Laser Focus World (May 1993).

Oliner et al., "Radiating Elements and Mutual Coupling", Microwave Scanning Antennas, vol. 2, pp. 131-141, (1966).

Raley et al., "A Fabry-Perot Microinterferometer for Visible Wavelengths", IEEE Solid-State Sensor and Actuator Workshop, Jun. 1992, Hilton Head, SC.

Sperger et al., "High Performance Patterned All-Dielectric Interference Colour Filter for Display Applications", SID Digest, pp. 81-83, (1994).

Stone, "Radiation and Optics, An Introduction to the Classical Theory", McGraw-Hill, pp. 340-343, (1963).

Walker, et al., "Electron-beam-tunable Interference Filter Spatial Light Modulator", Optics Letters vol. 13, No. 5, pp. 345-347, (May 1988).

Winton, John M., "A novel way to capture solar energy", Chemical Week, (May 1985).

Wu, "Design of a Reflective Color LCD Using Optical Interference Reflectors", ASIA Display '95, pp. 929-931, (Oct. 1995).

Liang, Zhi-Hao et al., "A Low Temperature Wafer-Level Hermetic MEMS Package Using UV Curable Adhesive", Electronic Components and Technology Conference, 2004 IEEE, pp. 1486-1491.

European Search Report for EP application No. 05255700.6.

European Search Report for EP application No. 05255684.2.

Greco et al., Optical properties of IPN-like networks polyethylene/poly(butylmethacrylate-co-styrene copolymer systems, III. Influence of copolymer crosslinkers, Polymer 42 (2001), 5089-5095.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Office Action dated Aug. 13, 2007 in U.S. Appl. No. 11/090,481.

Miles, MEMS-based interferometric modulator for display applications, Proceedings of the SPIE, Micromachined Devices and Components V, Sep. 1999, pp. 20-28.

Stark et al., An integrated process for post-packaging release and vacuum sealing of electroplated nickel packages, Transducers, 12th International Conference on Solid-State Sensors, Actuators and Microsystems, 2003. pp. 1911-1914.
Extended European Search Report for App. No. 05255678.4 dated Nov. 6, 2007.

Extended European Search Report for App. No. 05255677.6 dated Nov. 6, 2007.

* cited by examiner

SYSTEM AND METHOD FOR PROTECTING MICROELECTROMECHANICAL SYSTEMS ARRAY USING STRUCTURALLY REINFORCED BACK-PLATE

RELATED APPLICATION

This application claims the benefit of earlier filing date of U.S. Provisional Application No. 60/613,408 filed Sep. 27, 2004, which is hereby incorporated herein by reference in its entirety. Also, this application is related to U.S. patent application Ser. No. (not assigned), filed concurrently herewith and entitled "System and Method for Protecting Microelectromechanical Systems Array Using Back-Plate with Non-Flat Portion," which is hereby incorporated by reference herein.

BACKGROUND

1. Field of Technology

The disclosure relates to microelectromechanical systems (MEMS), and more particularly to protection of MEMS devices from damage.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap.

Such devices have a wide range of applications, and it would be beneficial in the art to utilize and/or modify the characteristics of these types of devices so that their features can be exploited in improving existing products and creating new products that have not yet been developed. In designing commercial products utilizing this MEMS technology, packaging is developed in consideration of the requirements of cost, reliability and manufacturability. The packaging associated with the MEMS devices can incorporate various features to protect MEMS elements from being damaged by external forces.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect of the invention provides an electronic device. The electronic device comprises a substrate having a surface, an array of microelectromechanical devices and a back-plate. The array of the microelectronic devices is formed on the surface of the substrate and has a back-surface facing away from the substrate. The back-plate is placed over the array and has an interior surface and an exterior surface. The interior surface of the back-plate faces the back-surface of the array with a gap therebetween. The exterior surface faces away from the substrate. The electronic device further comprises one or more reinforcing structures which are integrated with the back-plate. The reinforcing structures add stiffness to the back-plate. In the electronic device, a distance between the interior surface of the back-plate and the surface of the substrate may change over the surface of the substrate.

Another aspect of the invention provides an electronic device. The electronic device comprises a substrate having a surface; a microelectromechanical array and a back-plate. The array is formed on the substrate surface and has a back-surface facing away from the substrate. The back-plate is placed over the array and has an interior surface. The interior surface faces the back-surface of the array with a gap therebetween. The back-plate has a thickness varying along an edge thereof.

Still another aspect of the invention provides an electronic device. The electronic device comprises: a substrate; an array of interferometric modulators and a back-plate. The array is formed on the substrate and has a back-surface facing away from the substrate. The back-plate is placed over the array and has an interior surface facing the back-surface of the array with a gap between the interior surface of the back-plate and the back-surface of the array. The electronic device further comprises means for preventing the interior surface of the back-plate from directly contacting the back-surface of the array.

A further aspect of the invention provides a method of making an electronic device. The method comprises providing an intermediate device, providing a back-plate, placing the back-plate over the intermediate device and binding the back-plate and the substrate. The intermediate device comprises a substrate and an array of microelectromechanical devices formed on the substrate. The back-plate has an interior surface and an exterior surface. The back-plate is integrated with one or more reinforcing structures formed on at least one of the interior surface and the exterior surface. The back-plate is placed over the array of the intermediate device such that the interior surface of the back-plate faces the back-surface of the array with a gap therebetween. A further aspect of the invention provides an electronic device produced by the foregoing method of making such an electronic device.

Still another aspect of the invention provides an electronic device. The device comprises a substrate, an array of microelectromechanical devices formed on the substrate and a back-plate placed over the array. The back-plate has an interior surface and an exterior surface. The interior surface of the back-plate faces the array with a gap therebetween. The exterior surface faces away from the substrate. A distance between the interior surface of the back-plate and the substrate varies across the substrate.

A further aspect of the invention provides an electronic device. The electronic device comprises a substrate; an array of interferometric modulators formed on the substrate and a means for covering the array. The means comprises an interior surface and an exterior surface. The interior surface faces the array with a gap therebetween. The exterior surface faces away from the substrate. A distance between the interior surface of the covering means and the substrate varies across the substrate.

A still further aspect of the invention provides a method of making an electronic device. The method comprises providing an intermediate device which comprises a substrate and an array of microelectromechanical devices formed on the substrate. The method further comprises forming a back-plate over the array of the intermediate device with a gap between the back-plate and the array. The back-plate has an interior surface facing the array, and a distance between the interior surface and the substrate varies across the substrate. A further aspect of the invention provides an electronic device produced by the foregoing method of making such an electronic device.

DETAILED DESCRIPTION OF EMBODIMENTS

Various reinforcing structures are formed on a back-plate of MEMS devices. The reinforcing structures increase the stiffness of the back-plate and therefore prevent the back-plate from contacting and damaging the MEMS elements or array of the device. The reinforcing structures are integrated with the back-plate on either or both of the surfaces thereof. The back-plate can be formed in various configurations which improve the stiffness thereof or reduce the likelihood of it contacting the MEMS array when the back-plate is subject to an external force. The configurations include a curved back-plate, curved surfaces of the back-plate, a back-plate having one or more recesses, varying thickness of the back-plate, etc. The reinforcing structures and the various configurations can be combined to further prevent damage to the MEMS array when an external force is applied to the back-plate of a MEMS device.

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
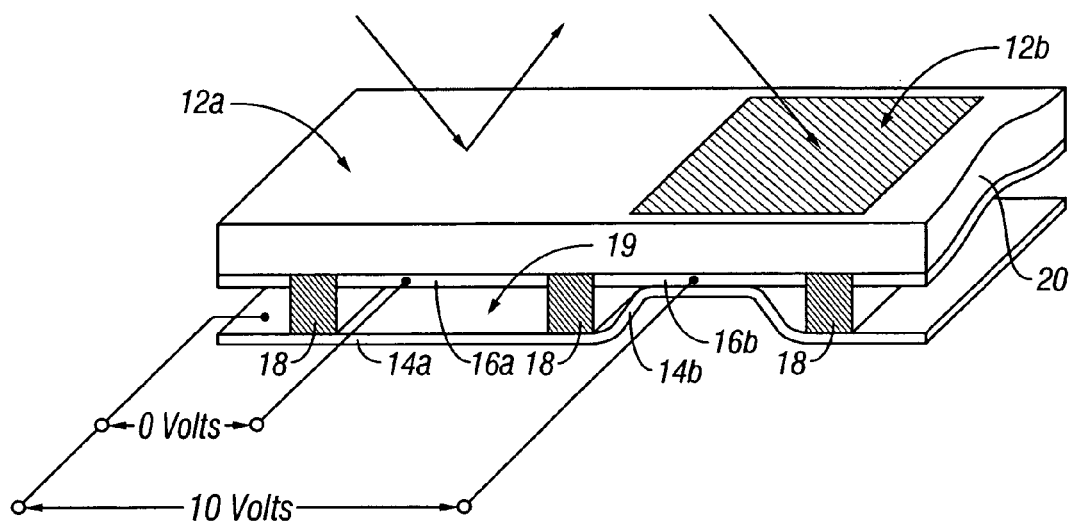
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
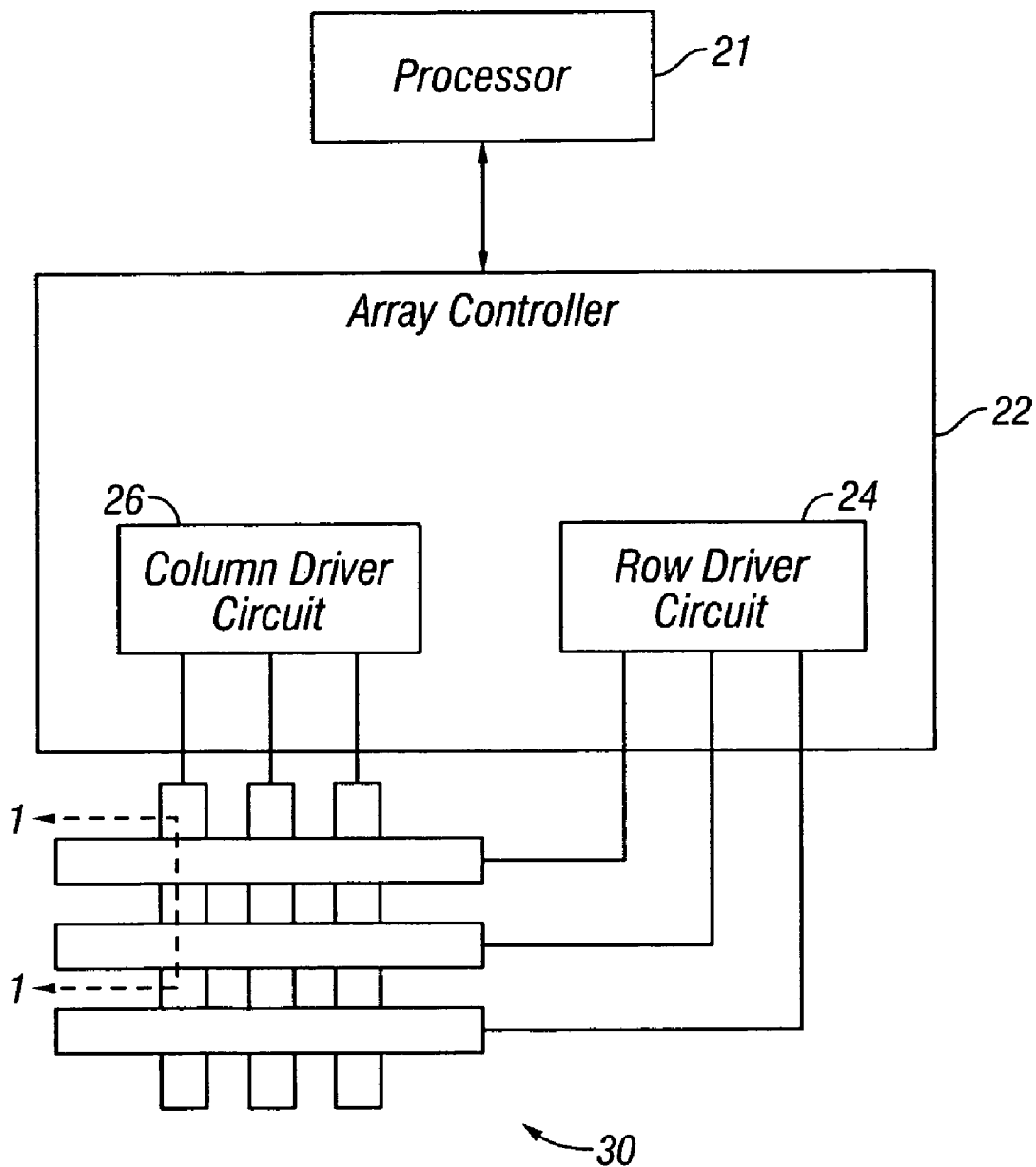
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single-or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
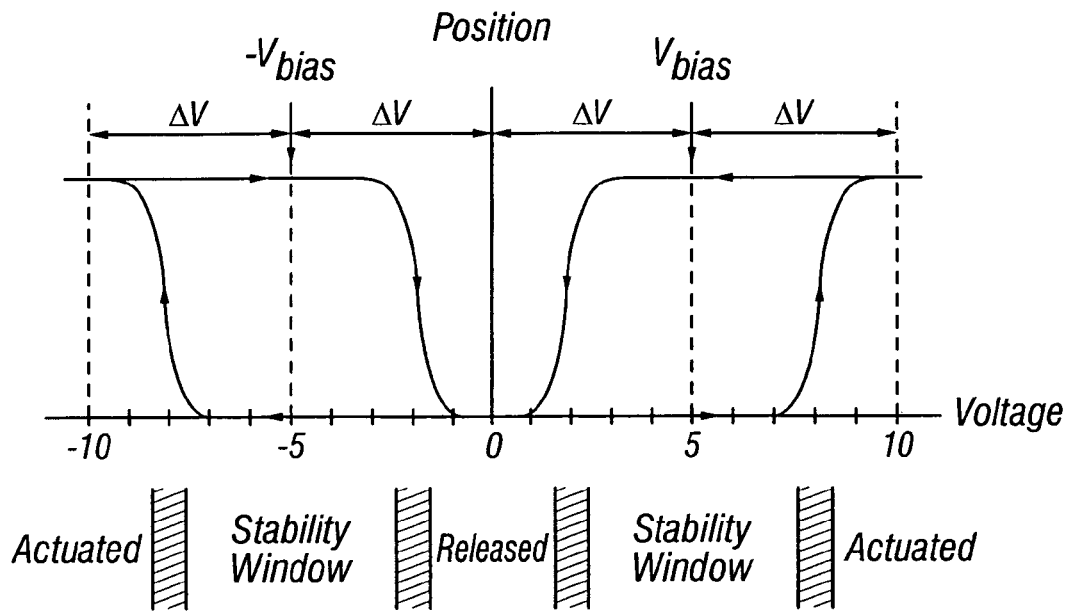
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively. Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
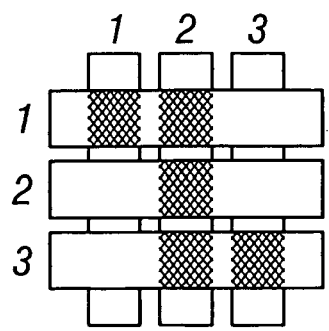
FIGS. 5A and 5B illustrate one exemplary timing diagram for row and column signals that may be used to write a frame of display data to the 3×3 interferometric modulator display of FIG. 2.
Figure 5B:
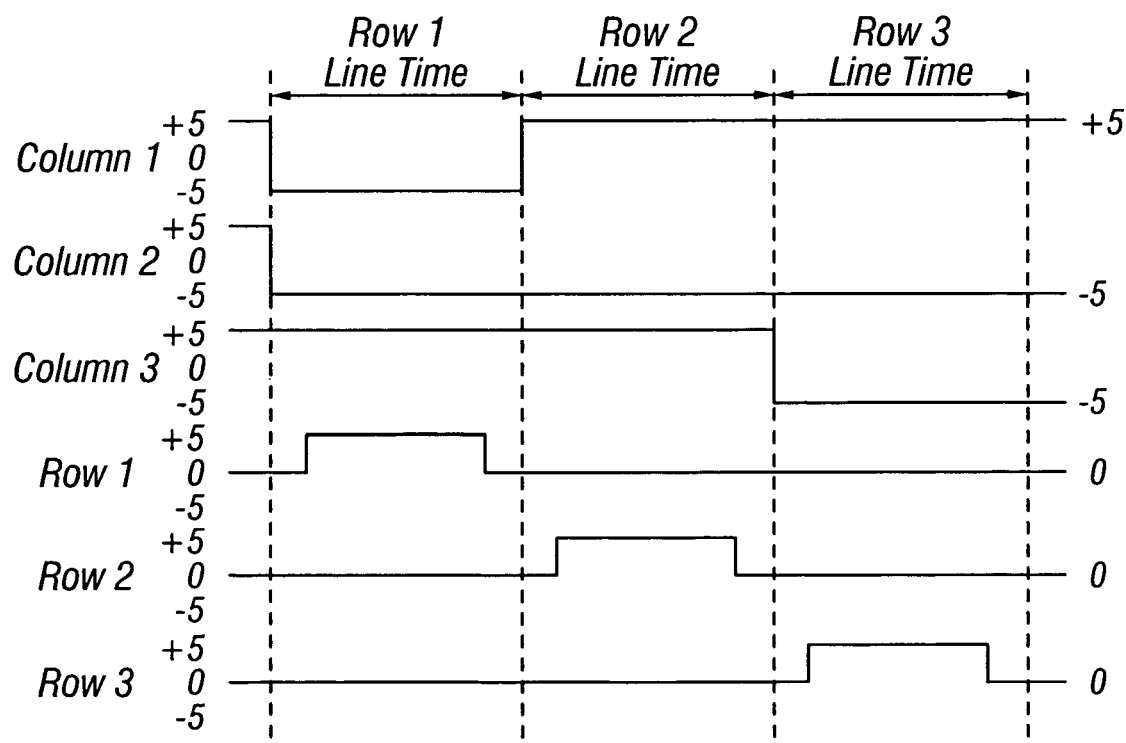

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
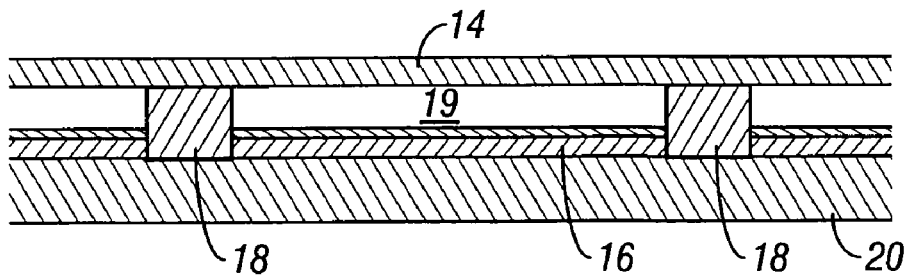
FIG. 6A is a cross section of the device of FIG. 1.
Figure 6B:
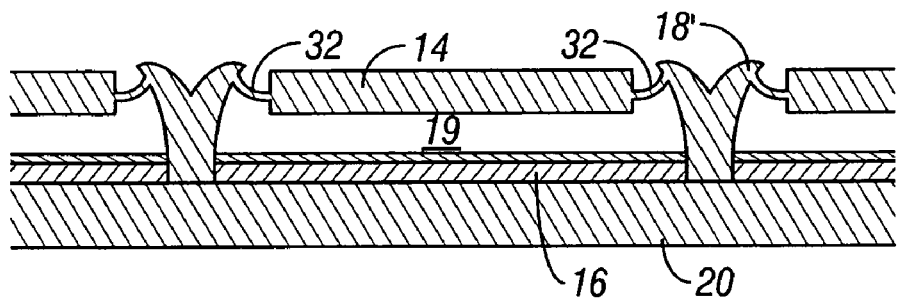
FIG. 6B is a cross section of an alternative embodiment of an interferometric modulator.
Figure 6C:
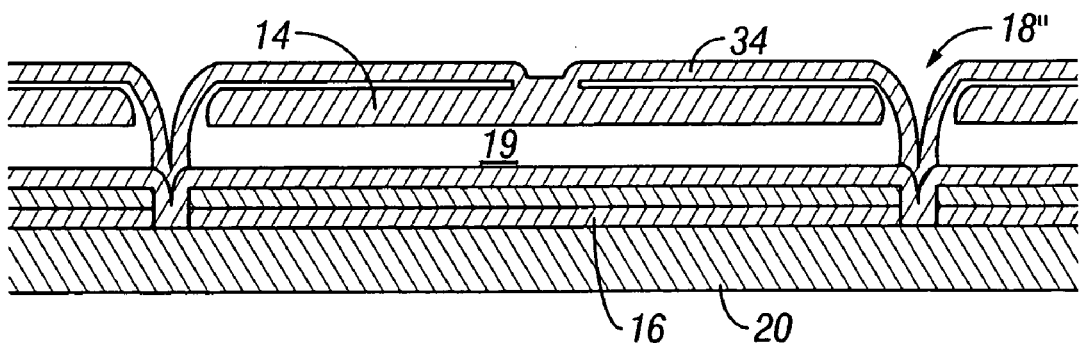
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

Figure 7:
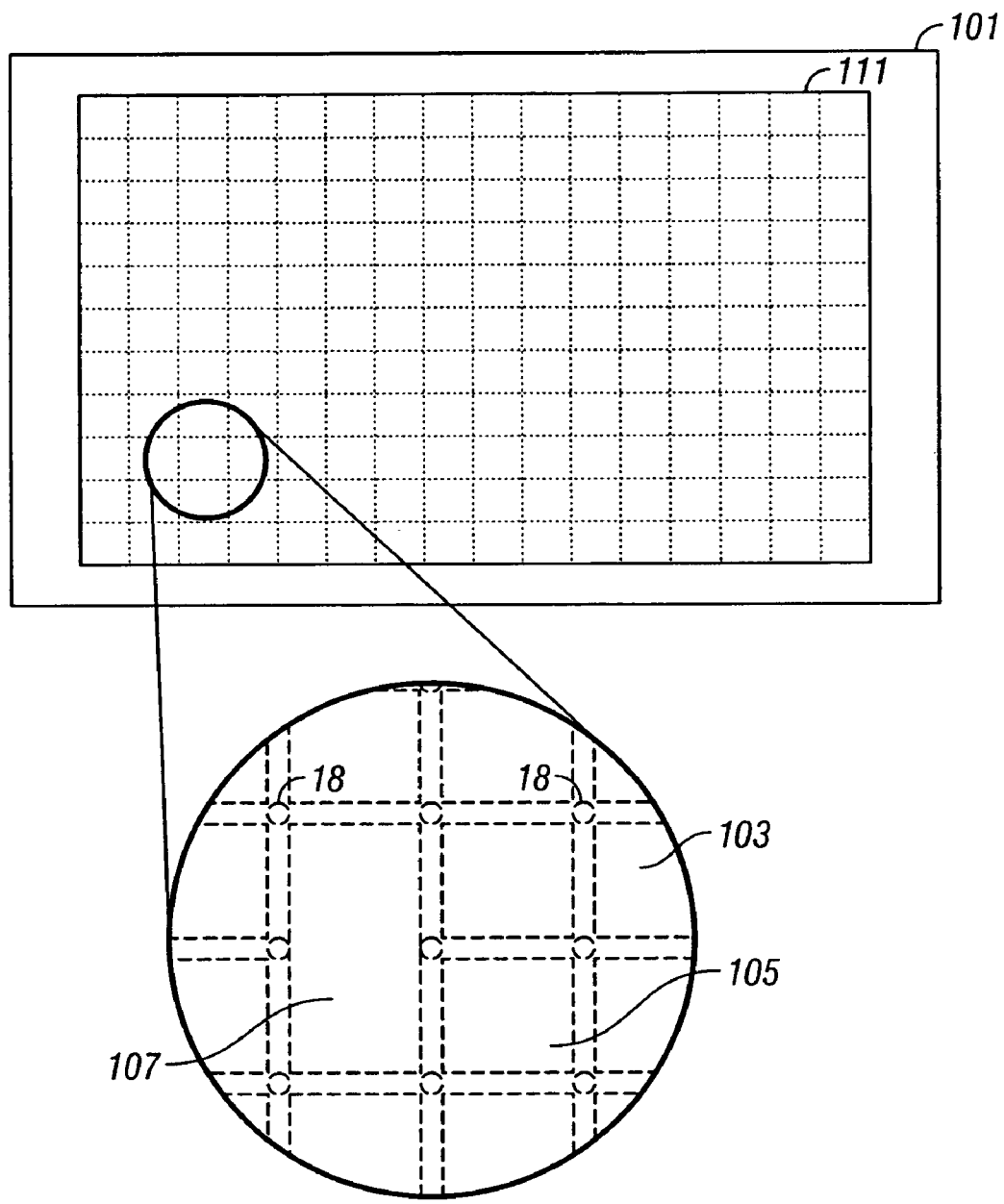
FIG. 7 is a top plan view illustrating a MEMS array.

FIG. 7 illustrates an embodiment of a MEMS array 111 formed on a substrate 101. The MEMS array 111 is comprised of a number of MEMS elements arranged on the substrate 101. Each MEMS element 103, 105, 107 corresponds to the interferometric modulator 12a or 12b. In the illustrated embodiment, the MEMS elements are substantially regularly arranged. The dotted lines are to represent the arrangement of the MEMS elements. In one embodiment, all of the MEMS elements in the array 111 have substantially the same size. In another embodiment, MEMS elements of the MEMS array 111 may have different sizes. As depicted in the enlarged portion of the MEMS array 111, for example, the elements 103 and 105 are defined by the four (4) neighboring posts 18 while the element 107 is defined by six (6) neighboring posts 18. Although, in the illustrated embodiment, the posts 18 are regularly arranged with substantially the same pitch, there may be variations in the locations of the posts 18 and the pitches between the neighboring posts 18.

The MEMS array 111 and its elements 103, 105, 107 form a robust construction. For example, although depicted as narrow columns in FIGS. 1, 6A, 6B and 6C, the posts 18, 18' and 18" may be constructed to be much wider than as shown in comparison to the depth (vertical distance) and width (horizontal distance) of the cavity 19. Thus, a force or pressure on the members 14 (FIGS. 6A and 6B) and 34 (FIG. 6C) of the MEMS elements from the top would not easily break the members 14 and 36 unless such a force or pressure is focused on a single MEMS element or a portion thereof. Nevertheless, this robustly constructed MEMS array 111 and individual MEMS elements are still susceptible to some strong forces that can be applied thereto. Thus, in the packaging of MEMS devices comprised of an array of MEMS elements, features to protect the structure and integrity of the MEMS elements and their array are implemented.

Figure 8:
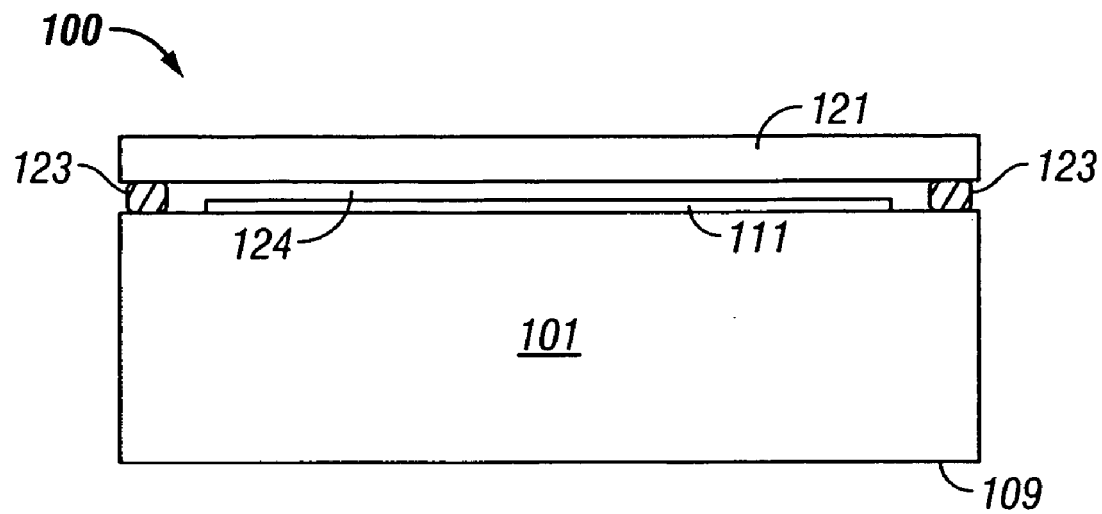
FIGS. 8 and 9 are side views illustrating a cross-section of packaged MEMS display devices.

FIG. 8 illustrates a typical packaging configuration of a MEMS device 100. As illustrated in FIG. 7, a MEMS array 111 is formed over the substrate 101. An image or information can be displayed on the bottom surface 109 of the substrate 101 by the operation of the MEMS array 111. A back-plate 121 is placed over but not in direct contact with the top surface of the MEMS array 111 and is supported by a sealing or bonding material 123 extending about the periphery thereof. The sealing or bonding material 123 bonds the back-plate 121 and the substrate 101 together.

The sealing 123 may be a non-hermetic seal made of a material, such as a conventional epoxy-based adhesive. In other embodiments, the sealing material may be a polyisobutylene (sometimes called butyl rubber, and other times PIB), o-rings, polyurethane, thin film metal weld, liquid spin-on glass, solder, polymers, or plastics, among other types of seals that may have a range of permeability of water vapor of about 0.2-4.7 g mm/m$^2$ kPa day. In still other embodiments, the sealing 123 may be a hermetic seal.

In some embodiments, the packaged MEMS device 100 includes a desiccant (not shown) configured to reduce moisture within the cavity 124. The skilled artisan will appreciate that a desiccant may not be necessary for a hermetically sealed package, but may be desirable to control moisture resident within the package. In one embodiment, the desiccant is positioned between the MEMS array 111 and the back-plate 121. Desiccants may be used for packages that have either hermetic or non-hermetic seals. In packages having a hermetic seal, desiccants are typically used to control moisture resident within the interior of the package. In packages having a non-hermetic seal, a desiccant may be used to control moisture moving into the package from the environment. Generally, any substance that can trap moisture while not interfering with the optical properties of the interferometric modulator array may be used as the desiccant. Suitable desiccant materials include, but are not limited to, zeolites, molecular sieves, surface adsorbents, bulk adsorbents, and chemical reactants.

The desiccant may be in different forms, shapes, and sizes. In addition to being in solid form, the desiccant may alternatively be in powder form. These powders may be inserted directly into the package or they may be mixed with an adhesive for application. In an alternative embodiment, the desiccant may be formed into different shapes, such as cylinders or sheets, before being applied inside the package.

The skilled artisan will understand that the desiccant can be applied in different ways. In one embodiment, the desiccant is deposited as part of the MEMS array 111. In another embodiment, the desiccant is applied inside the package 100 as a spray or a dip coat.

The substrate 101 may be a semi-transparent or transparent substance capable of having thin film, MEMS devices built upon it. Such transparent substances include, but are not limited to, glass, plastic, and transparent polymers. The MEMS array 111 may comprise membrane modulators or modulators of the separable type. The skilled artisan will appreciate that the back-plate 121 may be formed of any suitable material, such as glass, metal, foil, polymer, plastic, ceramic, or semiconductor materials (e.g., silicon).

The packaging process may be accomplished in a vacuum, pressure between a vacuum up to and including ambient pressure, or pressure higher than ambient pressure. The packaging process may also be accomplished in an environment of varied and controlled high or low pressure during the sealing process. There may be advantages to packaging the MEMS array 111 in a completely dry environment, but it is not necessary. Similarly, the packaging environment may be of an inert gas at ambient conditions. Packaging at ambient conditions allows for a lower cost process and more potential for versatility in equipment choice because the device may be transported through ambient conditions without affecting the operation of the device.

Generally, it is desirable to minimize the permeation of water vapor into the package structure and thus control the environment inside the MEMS device 100 and hermetically seal it to ensure that the environment remains constant. When the humidity within the package exceeds a level beyond which surface tension from the moisture becomes higher than the restoration force of a movable element (not shown) in the interferometric modulator 10, the movable element may become permanently stuck to the surface. If the humidity level is too low, the moisture charges up to the same polarity as the movable element when the element comes into contact with the coated surface.

As noted above, a desiccant may be used to control moisture resident within the MEMS device 100. However, the need for a desiccant can be reduced or eliminated with the implementation of a hermetic seal to prevent moisture from traveling from the atmosphere into the interior of the MEMS device 100.

The continued reduction in display device dimensions restricts available methods to manage the environment within the MEMS device 100 because there is less area to place a desiccant within the MEMS device 100. The elimination of the need for a desiccant also allows the MEMS device 100 to be thinner, which is desirable in some embodiments. Typically, in packages containing desiccants, the lifetime expectation of the packaged device may depend on the lifetime of the desiccant. When the desiccant is fully consumed, the interferometric modulator device may fail as sufficient moisture enters the package structure and damages the interferometric modulator array.

Figure 9:
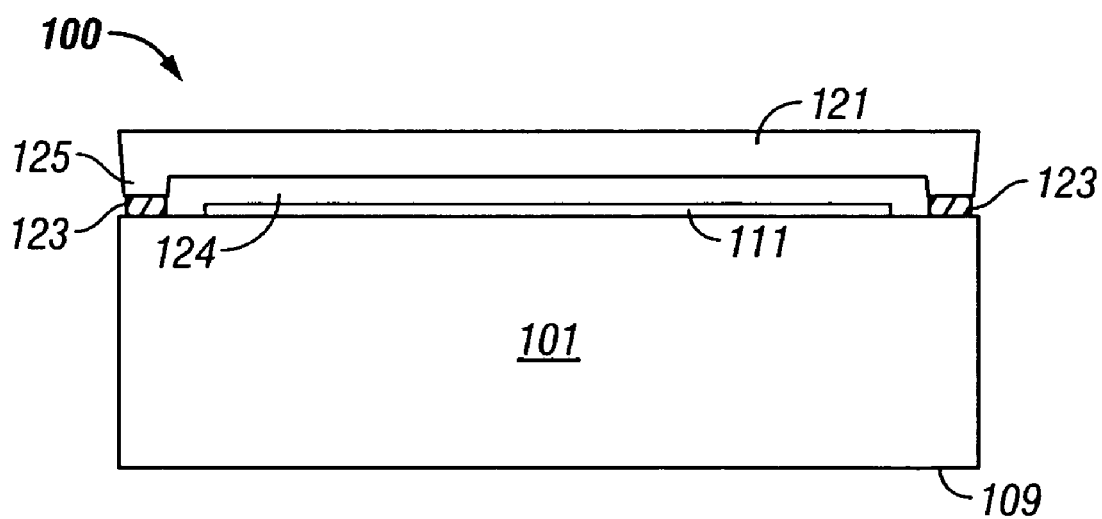

FIG. 9 illustrates another embodiment of packaging used in a MEMS device 100, in which the back-plate 121 has a protrusion 125 such as a lip along its edges. The protrusion 125 is connected to the substrate 101 by the bonding material 123. Use of this protrusion of the back-plate 121 creates the desired space or gap 124 between the back-plate 121 and the MEMS array 111 while reducing the necessary thickness of the sealing or bonding material 123. The illustrated back-plate 121 with the lip protrusion 125 can be produced by molding or forming. Alternatively, a structure forming the lip protrusion 125 can be attached to a substantially flat panel (not shown) along its edges, thereby creating the configuration of the back-plate 121 illustrated in FIG. 9. Still alternatively, the back-plate 121 with the lip protrusion 125 can also be formed by making a recess on a surface of a flat panel, wherein a central area of the surface is carved out, thereby forming the protrusion 125 along its edges. One can also make more than one recess in the flat back-plate 121. This has the effect of making ribs or reinforcing structures in the back-plate (FIGS. 16-24) as will be discussed later in detail. Here, the ribs or reinforcing structures can be formed by leaving the original material of the back-plate 121 in place in some regions, and forming recesses elsewhere.

Figure 10:
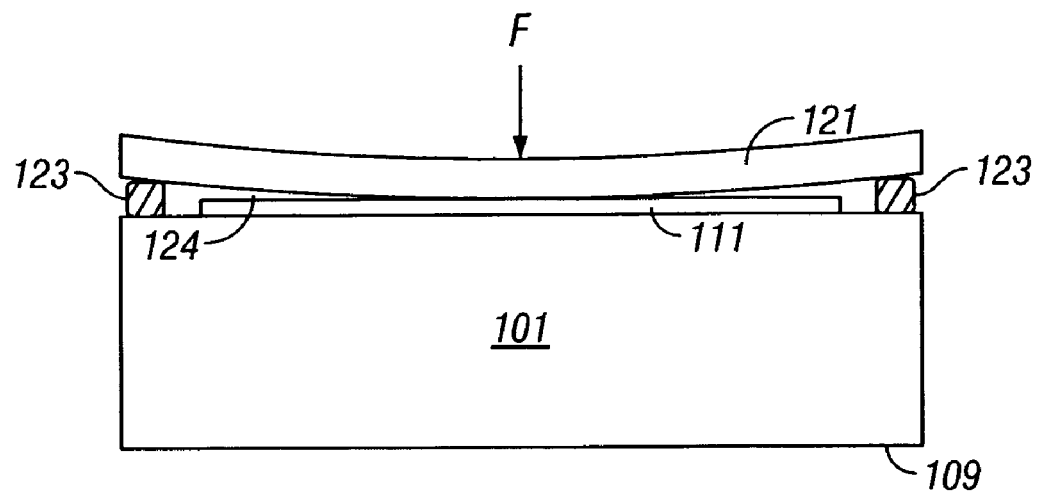
FIG. 10 is a side view illustrating bending of a back-plate of a packaged MEMS display device.

It is preferable that the back-plate 121 is assembled to the MEMS device 100 with the gap 124 between the MEMS array 111 and the back-plate 121. However, no-gap constructions (not illustrated) are also possible. The gap 124 can provide some protection against damaging of the MEMS array 111 by an external force applied on the back-plate 121. As illustrated in FIG. 10, the back-plate 121 will absorb such a force exerted on it by bowing within the gap 124 without touching the MEMS array 111 or with only slight touching. Thus, the external force may not be transferred to the MEMS array 111 or only a fraction of the force may be transferred to the MEMS array 111. The larger the gap 124, the better protection for the MEMS array 111. The size of the gap 124 can be controlled by adjusting thickness or height of the sealing or bonding material 123. Also, the size of the gap 124 can be controlled by adjusting the thickness of the lip protrusion 125 and/or the depth of the above-described recess.

Figure 11:
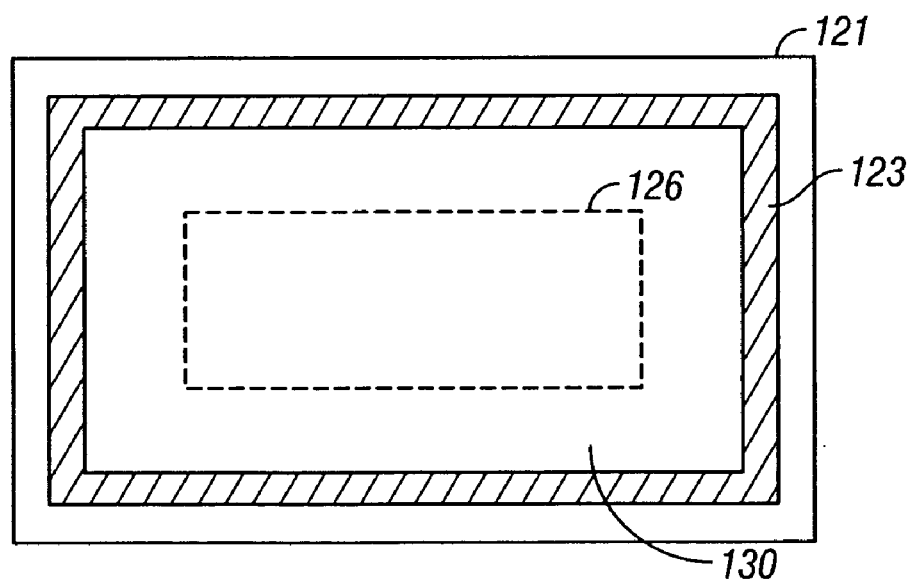
FIG. 11 is a top plane view of the back-plate of FIG. 10.

Although the gap 124 protects the MEMS device 100 as discussed, it is not always desirable to have a large gap because of the resulting increase in the overall thickness of the MEMS device 100. Further, in MEMS display devices having a large display area, forming a gap 124 between the MEMS array 111 and the back-plate 121 may not effectively protect the MEMS array 111 from being damaged. Referring to FIG. 11, the central area 126 of the back-plate 201, particularly in a display having a large display area, is remote from the sealing/bonding material 123 that maintains the distance between the substrate 101 and the back-plate 201, and therefore maintains the size of the gap 124. In the package constructions shown in FIGS. 8-10, there is no structural support to maintain the size of the gap 124 in the central area 126 of the back-plate 121 (FIG. 11). Thus, external forces exerted onto the central area 126 would be more likely to be transferred to the MEMS array 111 than other areas that are close to the sealing/bonding material 123.

Figure 12:
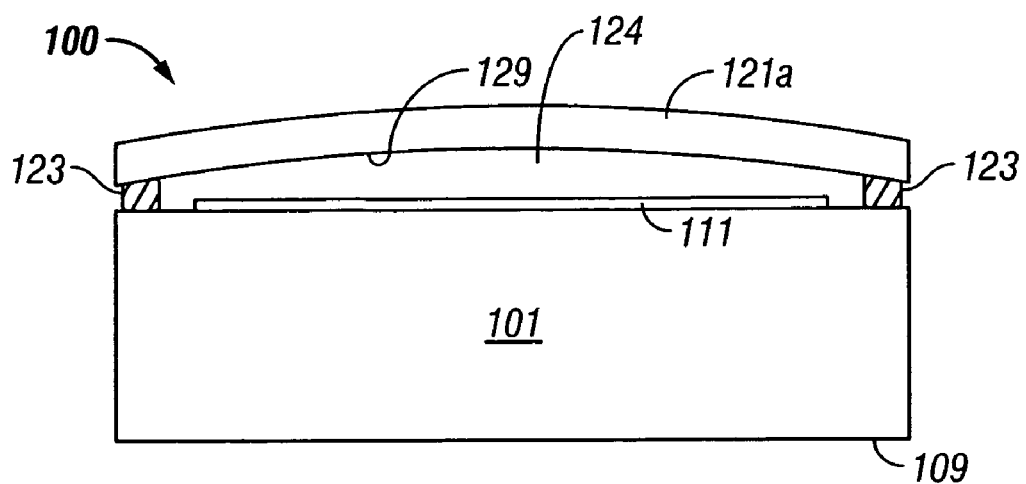
FIGS. 12, 14, 16, 18, 20, 22, 24-26 are side views illustrating a cross-section of packaged MEMS display device with various constructions of the back-plate.

FIG. 12 illustrates another embodiment of the MEMS device 100 having a curved back-plate 121a. In the illustrated embodiment, the curved back-plate 121a covers the MEMS array 111 and bows out away therefrom. Thus, the curved back-plate 121a provides one means for covering the MEMS array 111. As will be discussed in more detail below, the curved configuration will provide a larger gap 124 between the MEMS array 111 and the back-plate 121a, particularly in the central area 126 (FIG. 11) of the back-plate 121a. Further, the curved configuration will increase the stiffness of the back-plate 121a. This increased stiffness results in a reduced deflection for a given load relative to a flat plate of similar thickness.

In the embodiment illustrated in FIG. 12, the depth of the gap 124 may be greater than that of the MEMS device illustrated in FIG. 8 throughout the gap 124. The term, the depth of the gap 124, refers to the distance between the top surface of the MEMS array 111 and the interior surface of the back-plate 121a. Further, the bowed-out construction of the back-plate 121a may be deflected less when the back-plate 121a is subjected to an external force. With the larger gap depth and the increased stiffness of the back-plate 121a, the MEMS array 111 in this embodiment is less susceptible to being contacted and damaged by external forces exerted on the back-plate 121a than in the case of the flat back-plate embodiment of FIG. 8. Thus, the curved configuration provides one means for preventing the back-plate from directly contacting the MEMS array 111 and also provides a means for reducing or minimizing the likelihood of such contact.

Moreover, in the curved construction of the back-plate 121a, the depth of the gap 124 is greater in the central area than in the other areas of the back plate. Accordingly, even in a large display, an external force applied onto the central area 126 would not necessarily be more easily transferred to the MEMS array 111 than forces applied onto the other areas 130. Thus, the area of the MEMS array 111 corresponding to the central area 126 of the back-plate 121a would be better protected from being damaged by external forces or pressure than in the case of the flat back-plate 121 embodiment of FIG. 8.

Figure 13A:
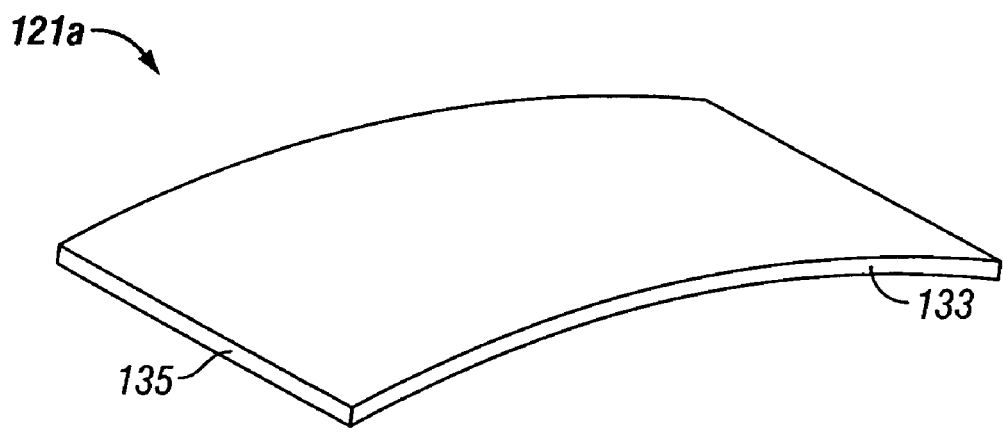
FIGS. 13A and 15 are perspective views illustrating the shape of the back-plates used in FIGS. 12 and 14, respectively.

A perspective view of the curved back-plate 121a is showing in FIG. 13A. Although, in the illustrated embodiment, the back-plate 121a is bowed only along the edge 133, it may be also bowed along the edge 135. In the embodiment where the back-plate 121a is bowed along both of the edges 133 and 135, the radii of the curvature along the edges 133 and 135 may be the same. Then, the back-plate 121a would essentially comprise a fragment of a spherical shell. In another embodiment, the radii of the curvature along the edges 133 and 135 may be different from each other.

In embodiments of the invention, the back-plate 121a is curved such that the radius of the curvature (R) may be constant or vary over the curvature of the back-plate 121a. In another embodiment, the curved back-plate 121a may include a flat section. The radius of the curvature (R) is, for example, from about 50 mm to about 5000 mm, whether it varies or is a constant. Preferably, the radius of the curvature is selected from about 100 mm to about 700 mm. The thickness of the back-plate 121a is from about 0.1 mm to about 5.0 mm although not limited thereto. Preferably, the thickness is from about 0.4 mm to about 1.5 mm. One of ordinary skill in the art will be able to adjust appropriate thicknesses within the described ranges of thickness in consideration of the characteristics of the materials for use in the back-plate 121a.

The curved back-plate 121a can be made of a variety of materials. For example, the materials for the back-plate 121a can be steel alloys, including stainless steel alloys, metals, metal alloys, glass, polymers, oxides of metallic or semiconductor materials, ceramics, etc. Preferably, the materials are chosen from those having a thermal expansion coefficient which matches that of the substrate 101 upon which the MEMS array 111 is fabricated. Examples of such a material include KOVAR® alloy, which is an iron alloy containing Ni and Co as principal alloying elements.

The curved back-plate 121a can be produced by a variety of methods. In one embodiment, for example, a substantially flat sheet is subject to warping or stress so as to produce the curved back-plate 121a. The substantially flat sheet may be subject to sheet forming or drawing. In another embodiment illustrated in FIGS. 13B and 13C, a substantially flat panel 136 having, for example, two layers 137 and 139 of two different materials is subjected to heat. The two materials of the two layers 137 and 139 have different thermal responses, for example, different heat expansion or shrinkage rates. Applying heat to the flat panel 136 produces a curved configuration due to the different thermal responses of the materials in the layers 137 and 139. In another embodiment, the flat panel 136 may include more than two layers.

Figure 13B:
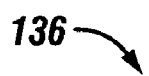
FIGS. 13B and 13C are side views of a back-plate illustrating production of the back-plate illustrated in FIGS. 12 and 13A.
Figure 13B:
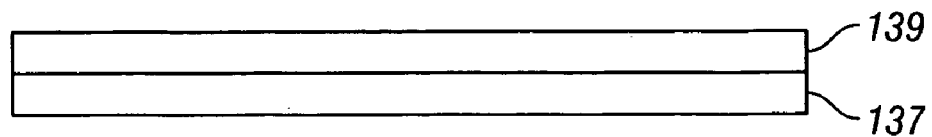
Figure 13C:
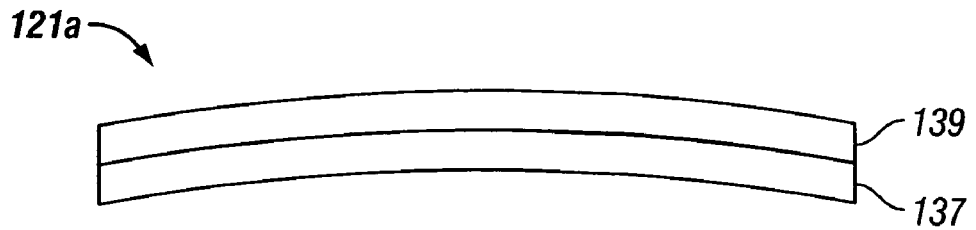

In some embodiments, forming the back-plate 121a may be produced in the assembly process of the MEMS device 100. In one embodiment, a substrate 101, a flat panel 136 and a thermally curable material for the perimeter sealing 123 are configured as illustrated in FIGS. 8 or 9. This is an intermediate configuration of the device 100 in the assembly process. When heat is applied to this intermediate product to cure the thermally curable material, the flat panel 136 produces a curved configuration due to the different thermal responses of the layers 137 and 139 (FIGS. 13B and 13C). In this process, the curvature is created at the same time the seal 123 is being cured, and the curvature remains even after the structure is cooled to room temperature since the back-plate 123 and substrate 101 are firmly integrated with the cured seal 123.

In other embodiments, the back-plate 121a may be formed into a bowed configuration by use of a substantially flat panel that has a single thermal expansion coefficient as opposed to the flat panel 136 having two or more layers with different thermal expansion coefficients. The single thermal expansion coefficient of the back-plate material may be different from that of the substrate 101. Preferably, the thermal expansion coefficient of the back-plate material is smaller than that of the substrate 101. As with the embodiment described previously, the intermediate configuration in the assembly process is as illustrated in FIG. 8 or 9 except that the sealing 123 of a thermally curable material has not been cured yet. This device is heated to a temperature slightly below the curing temperature of the thermally curable material, which will allow the materials for the back-plate 121a and the substrate 101 to expand without firmly bonding to the sealing material. Then, the ambient temperature is elevated to the curing temperature, thereby curing the sealing material and firmly integrating the substrate 101, sealing material 123 and the flat panel for the back-plate 121a. The integrated device is cooled to room temperature. Due to the difference in the thermal expansion coefficient, the material of the back-plate (flat panel) shrinks less than the substrate 101. Since the substrate 101 and the flat panel is firmly integrated, the greater shrinkage in the substrate 101 will create stress in the flat panel, which will cause the flat panel to deform to the bowed configuration as shown in FIG. 12.

In still another embodiment, an intermediate device in the assembly process is configured as illustrated in FIG. 8 or 9, in which the sealing 123 is a UV-light curable material which substantially seals the perimeter of the device but has not been fully cured yet. The device is placed in a chamber, which is subject to a pressure lower than that of the inside of the intermediate device. Since the UV-light curable material substantially seals the perimeter of the device, the pressure outside the device will not substantially affect the pressure inside the device. This lower pressure outside the device relative to the inside will cause the flat panel (FIG. 8 or 9) to bow or curve outward. Then, the UV-light curable material is fully cured with the application of UV light thereto, thereby fixing the curvature of the back-plate. One of ordinary skill in the art will appreciate appropriate methods available for producing the back-plate 121a.

Figure 14:
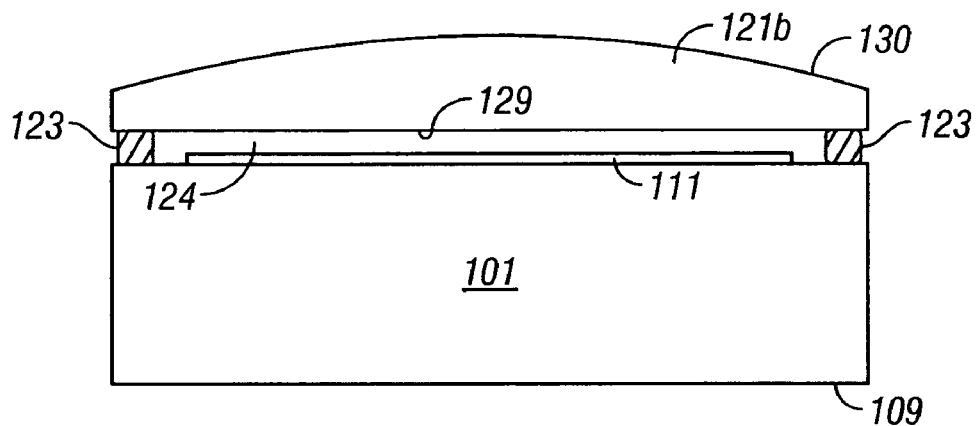
Figure 15:
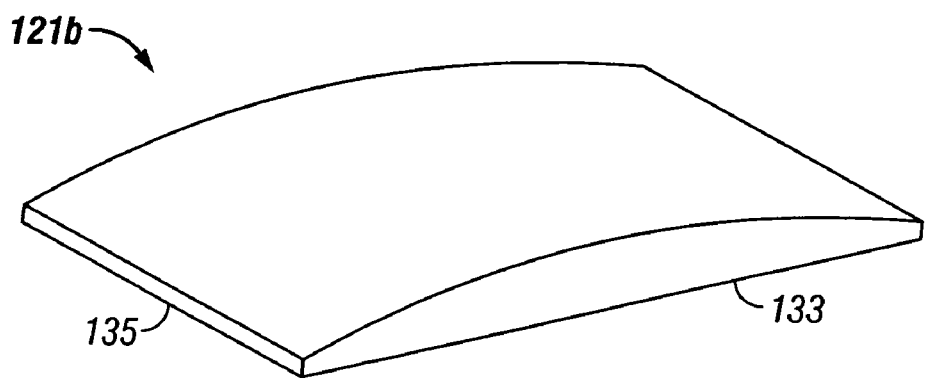

FIGS. 14 and 15 illustrate another embodiment of the back-plate 121b in accordance with the invention. In this embodiment, the back-plate 121b has varying thickness along the edge 133. The back-plate 121b with varying thickness provides one means for covering the MEMS array 111. The thickness is greater in the middle area than both sides of the middle area along the edge 133. In the illustrated embodiment, the interior surface 129 that faces the MEMS array 111 is formed in a substantially flat configuration while the opposing exterior surface 130 of the back-plate 121b is bulged. The thickness of the back-plate 121b gradually increases from one end of the edge 133 and then gradually decreases toward the other end of the edge 133. Preferably, the thickness of the back-plate 121b ranges from about 0.1 mm to about 5 mm, and more preferably from about 0.4 mm to about 1.5 mm. The two ends of the back-plate 121b along the edge (the thinnest portions) have a thickness preferably from about 0.1 mm to about 3.0, and more preferably from about 0.2 mm to about 1.5 mm. The center of the back-plate 121b (the thickest portion) has a thickness preferably from about 0.4 mm to about 5 mm, and more preferably from about 0.4 mm to about 3 mm. The thickness of the back-plate 121b and its areas may not be limited to the above-described ranges. One of ordinary skill in the art will be able to design appropriate thicknesses of the back-plate 121b and its areas in consideration of the characters of the materials for the back-plate 121b.

The back-plate 121b of FIGS. 14 and 15 is made of various materials. The materials for making the back-plate 121a of FIG. 12 can be used for the back-plate 121b. The back-plate 121b can be produced by various methods. In one embodiment, for example, a substantially flat panel such as the one shown in FIG. 8 is machined to provide the construction shown in FIGS. 14 and 15. In another embodiment, the back-plate 121b of FIGS. 14 and 15 is produced by molding. One of ordinary skill in the art will appreciate that appropriate methods are available for producing the back-plate 121b upon selection of the material(s) for use in the back-plate 121b.

In the embodiment of FIGS. 14 and 15, the depth of the gap 124 is about the same as that of the embodiment of FIG. 8 if all the other conditions are the same. Also, the depth of the gap 124 in the central area of the back-plate 121b is about the same as in the other areas of that back-plate 121b. However, the construction of a thicker middle area increases the stiffness of the back-plate 121b particularly in the middle area. With the increased stiffness in the middle area along the edge 133, the back-plate 121b is less susceptible to external forces or pressure exerted thereon, particularly in the central area 126 than is the embodiment illustrated in FIG. 8. Thus, the varying thickness configuration provides one means for preventing the back-plate from directly contacting the MEMS array 111 and also provides a means for reducing or minimizing the likelihood of such contact.

In some embodiments (not illustrated,) the thickness of the back-plate 121b may change linearly or stepwise. In other embodiments (not illustrated,) the back-plate thickness may vary along the other edge 135, where the thickness may change gradually or stepwise. In still other embodiments (not illustrated,) the interior surface 129 is bulged toward the MEMS array 111 while the exterior surface 130 remains substantially flat. Still in another embodiment (not illustrated,) both of the interior surface 129 and exterior surface 130 are curved away from each other. In one of such embodiment, the maximum distance between the interior and exterior surfaces is in the center of the back-plate. In a further embodiment, both the interior surface 129 and exterior surface 130 are curved like the embodiment of FIG. 12 while the thickness of the back-plate varies along the edge 133 or both of the edges 133 and 135.

In some embodiments, the back-plate 121b of FIG. 15 may have one or more recesses formed on its interior surface 129 (not illustrated). The back-plate with one or more recesses provides one means for covering the MEMS array 111. Also, the one or more recesses provides means for preventing the back-plate 111 from directly contacting the MEMS array or means for reducing or minimizing the likelihood of such contact. For example, the one or more recesses may be formed on the central area of the back-plate 121b. In such constructions, the depth of the gap 124 in the central area 126 may be greater than that of the other areas. In one embodiment, the one or more recesses may be configured to facilitate retaining a desiccant therein. In another embodiment, multiple recesses are formed such that partitioning walls of the multiple recesses function as reinforcing structures or ribs, which increase the stiffness of the back-plate, as will be discussed further with reference to FIGS. 16-26. The one or more recesses may be formed by removing some material of the back-plate 121b that does not have a recess.

FIGS. 16-26 illustrate additional exemplary embodiments of the back-plate, identified as 121c, 121d, 121e, 121f, 121g, 121h and 121i, in packaging the MEMS array 111. The back-plates 121c, 121d, 121e and 121f (FIGS. 16-23) are reinforced forms of the back-plate 121a of FIG. 12. All of the variations of the back-plate 121a can be further reinforced in the ways as described further with reference to FIGS. 16-23. Also, the back-plate 121b (FIGS. 14 and 15) and its variations may also be reinforced in similar ways. Moreover, all of these features and the variations thereof can be combined with the feature of the lip protrusion described above with reference to the embodiment of FIG. 9. These back-plates with reinforcing structures provide one means for covering the MEMS array 111. Also, as will be described in detail, the reinforcing structures provide one means for preventing the back-plate from contacting the MEMS array 111 or means for reducing or minimizing the likelihood of such contact.

Figure 16:
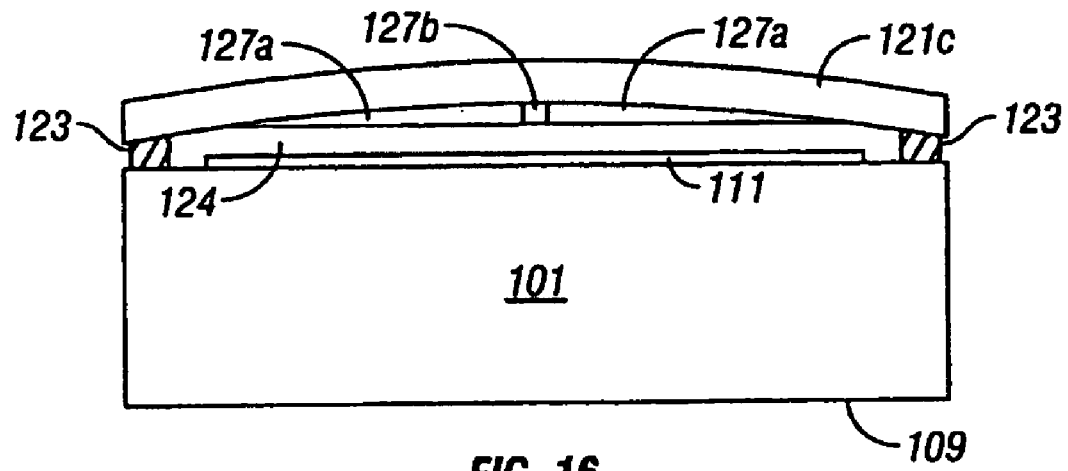
Figure 17A:
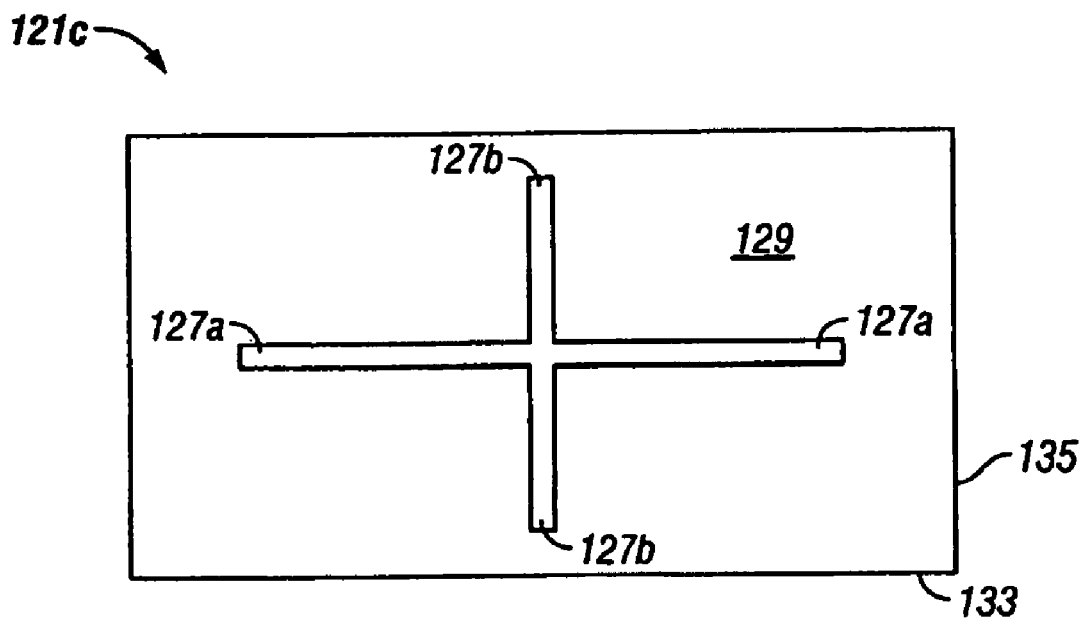
FIGS. 17A-17C, 19, 21 and 23 are bottom plan views illustrating reinforcing structures of the back-plates used in FIGS. 16, 18, 20 and 22, respectively.
Figure 17B:
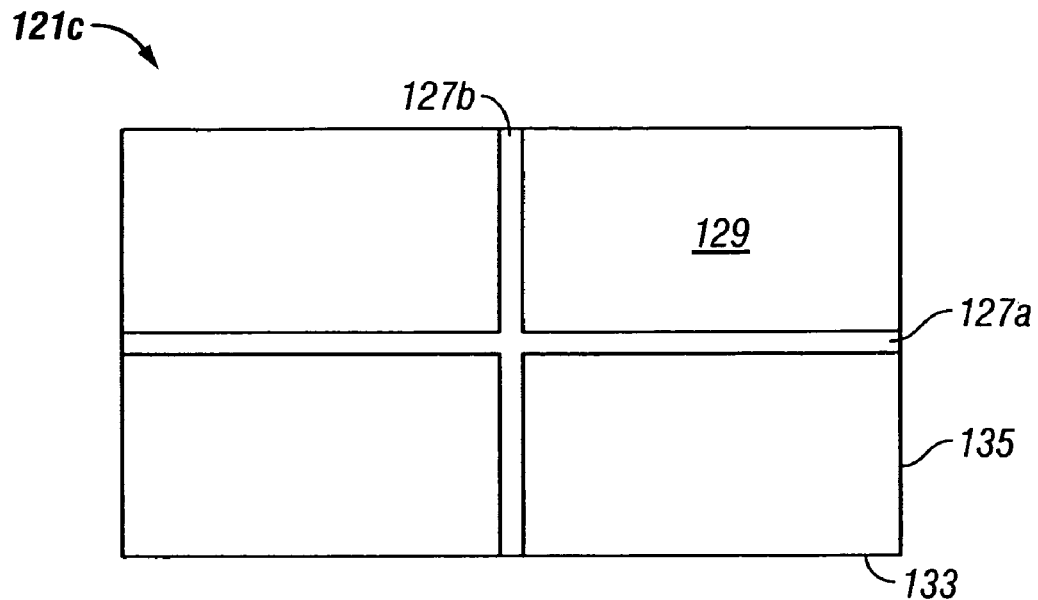
Figure 17C:
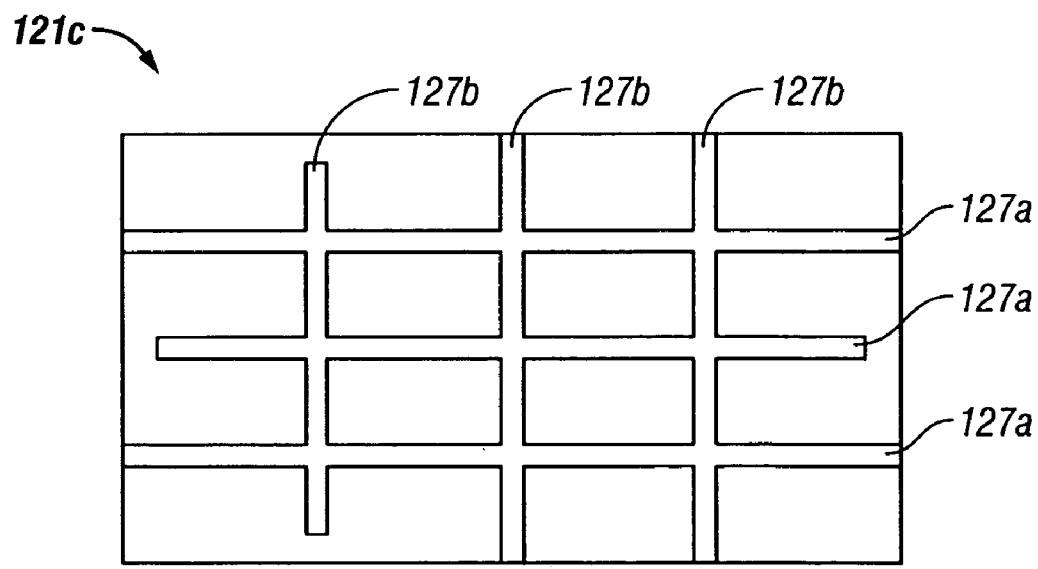

Referring to FIGS. 16-23, the back-plates 121c, 121d, 121e and 121f have reinforcing structures or ribs 127a, 127b and/or 127c formed on the interior surface thereof. In the embodiment of FIGS. 16 and 17, the reinforcing structures or ribs 127a and 127b extend substantially parallel to the edges 133 and 135 of the back-plate 127c, respectively. Referring to FIGS. 17A and 17B, the reinforcing structures 127a and 127b cross each other at about the center of the back-plate 121c. As illustrated in FIG. 17A, the reinforcing structures 127a and 127b extend within only a portion of the back-plate 121c. Alternatively, as showing in FIG. 17B, the reinforcing structures 127a and 127b may extend from an edge to the opposing edge of the back-plate 121c. In an embodiment where the lip protrusion 125 (see FIG. 9) is provided, the reinforcing structures 127a and 127b may connect the portions of the protrusion 125 that are located along two opposing edges of the back-plate 121c. Referring to FIG. 17C, multiple reinforcing structures 127a and 127b cross each other and form a grid structure. Some of the reinforcing structures may extend from an edge to the opposing edge of the back-plate 121c, while other reinforcing structures may not. The number and density of the reinforcing structures 127a and 127b can vary and be adjustable depending upon other design factors.

Figure 18:
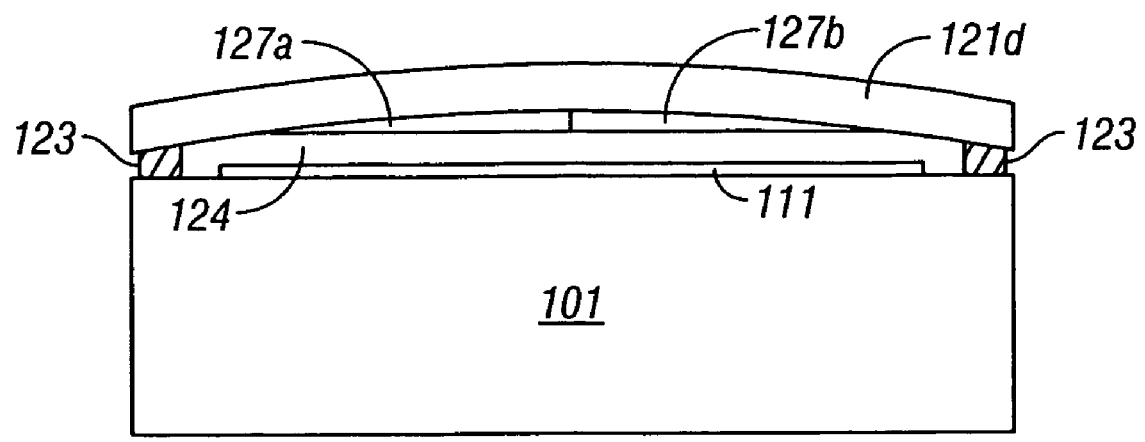
Figure 19:
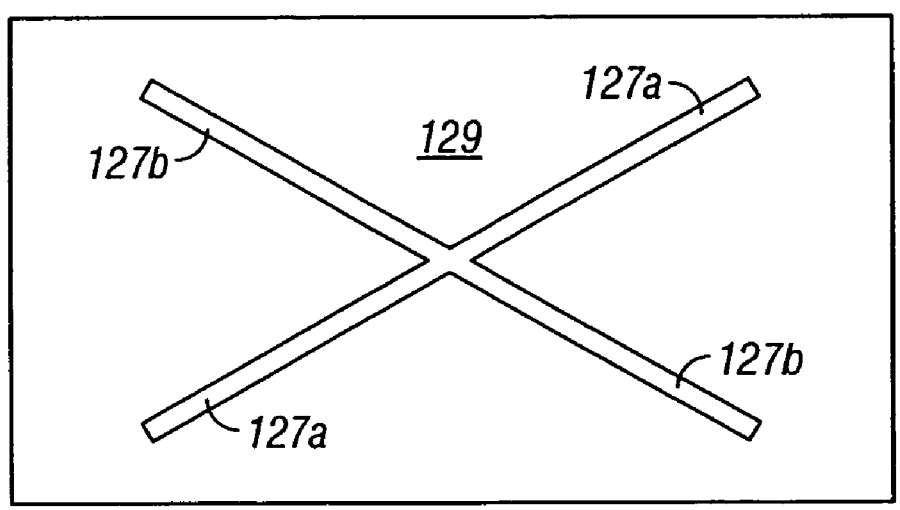

In the embodiment of FIGS. 18 and 19, the reinforcing structures or ribs 127a and 127b also cross each other at about the center of the back-plate 121d. However, the reinforcing structures 127a and 127b extend in substantially diagonal directions of the back-plate 121d on its plan view (FIG. 19). Although not illustrated the diagonally directed reinforcing structures of the back-plate 121d may have variations such as the extension to the edges thereof and the grid structure as shown in FIGS. 17B and 17C. Similar variations may be applicable to other embodiments of the reinforcing structures that have been described and will be described below.

In the back-plates 121c and 121d (FIGS. 16-19), the surfaces of the reinforcing structure 127a (or both 127a and 127b) facing the MEMS array 111 are substantially flat. Accordingly, the thickness of the reinforcing structure 127a (or both 127a and 127b) varies as the interior surface 129 of the back-plate 121c and 121d is curved. More specifically, the thickness of the reinforcing structures 127a and 127b are greater in the central area of the back-plate 121c and 121d than in the peripheral areas thereof. In other embodiments, the thickness of the reinforcing structures 127a and/or 127b may vary irrespective of the curvature of the interior surface of the back-plate. In other embodiments, the thickness may be substantially constant throughout the reinforcing structures 127a and/or 127b.

Figure 20:
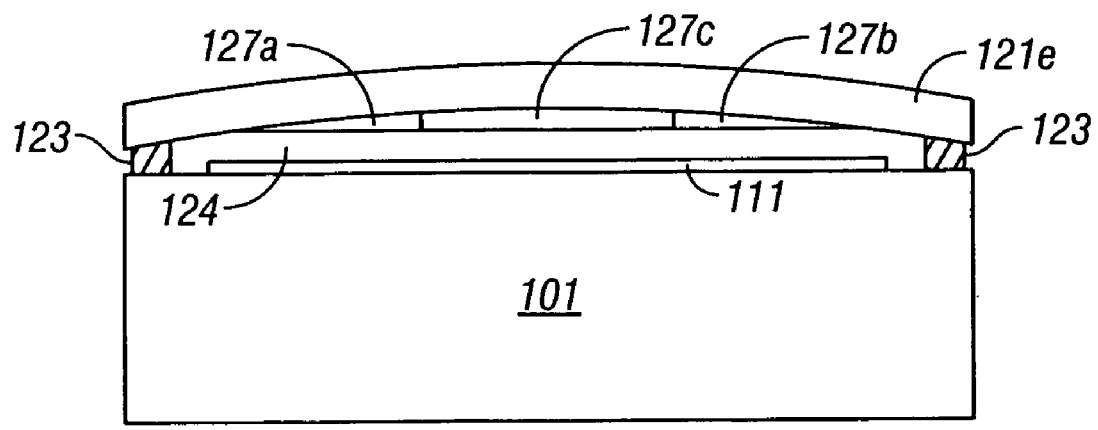
Figure 21:
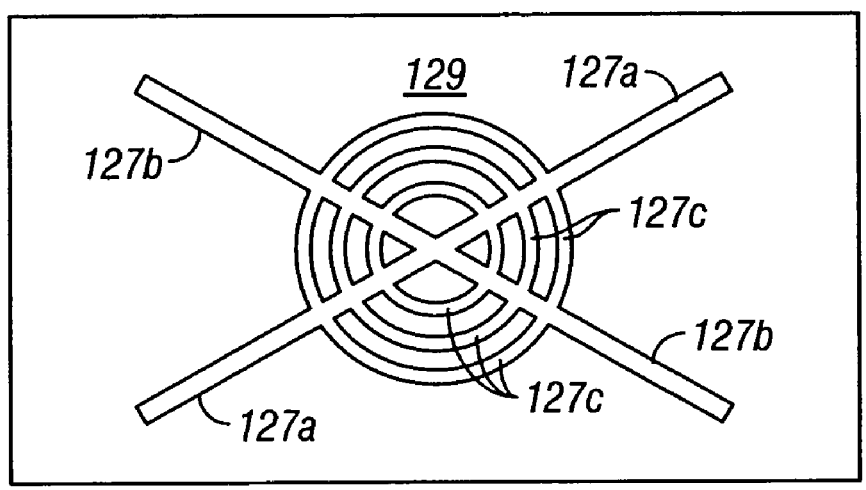

In the back-plate 121e illustrated in FIGS. 20 and 21, additional reinforcing structures 127c are added to the construction of the back-plate 121d (FIG. 19). The added reinforcing structures 127c are generally concentric circles connecting to the other reinforcing structures 127a and 127b. The reinforcing structures 127c are formed generally in the central area of the back-plate 121e. The reinforcing structures 127c connecting the other structures 127a and 127b may be in any forms other than concentric circles, including networking meshes (not illustrated). The connecting reinforcing structures 127c may be added to the construction of back-plate 121c and 121d (FIGS. 17 and 18).

Figure 22:
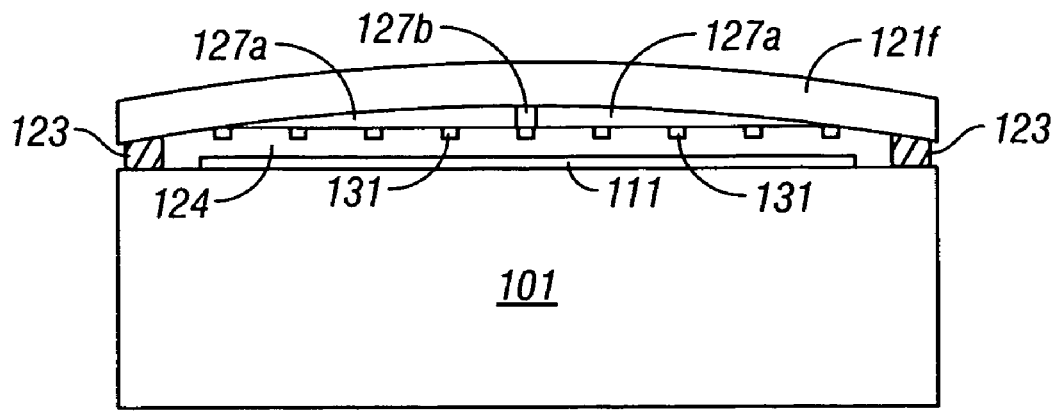
Figure 23:
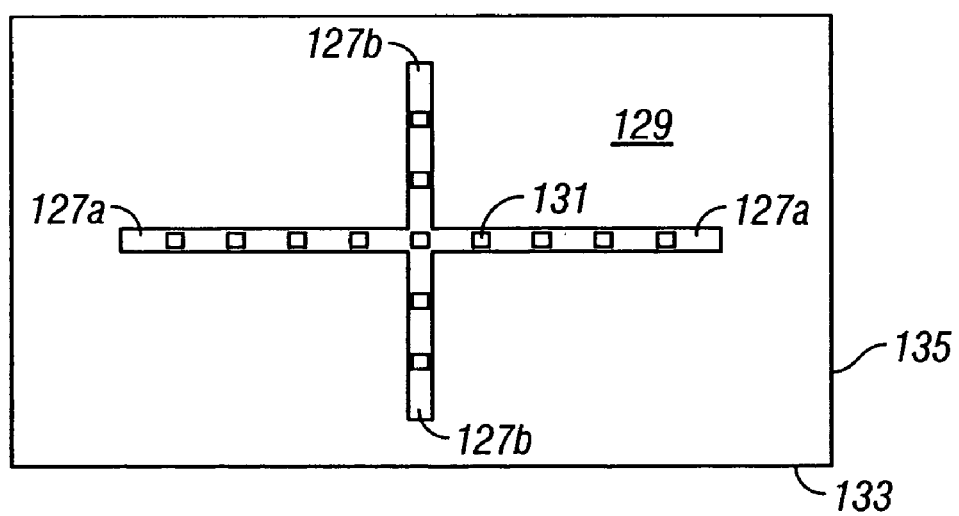

In the back-plate 121f illustrated in FIGS. 22 and 23, protrusions or spacers 131 are formed on the reinforcing structures 127a and 127b of the construction of back-plate 121c (FIG. 17) or 121d (FIG. 18). The protrusions or spacers 131 can distribute forces that may otherwise be exerted onto a small focused area of the MEMS array 111 to multiple locations and therefore reduce the impact of such forces to the MEMS array 111. In the illustrated embodiment, the protrusions or spacers 131 are provided generally regularly throughout the surface of the reinforcing structures 127a and 127b. The protrusions or spacers 131 may be distributed with different densities over defined areas. The protrusions or spacers 131 may have the same or different heights. Similar protrusions or spacers 131 may be formed on all or parts of the reinforcing structures 127a, 127b and/or 127c in the back-plates 121c-121e. Also, protrusions or spacers 131 may be formed on the interior surfaces 129 of the back-plates 121a-121b.

In another embodiment, the protrusions or spacers 131 are formed or located such that they contact only predetermined portions of the MEMS array 111 when external force is applied to the back-plate. In this embodiment, the external force is transferred substantially only to the predetermined portions of the MEMS array. Preferably, the predetermined portions are the portions of the MEMS array that are not likely affecting the operation of the MEMS device even if damaged. Additionally or alternatively, the predetermined portions are portions of the MEMS array that are less susceptible to damage by external forces. In still another embodiment, the protrusions or spacers 131 may be formed on only certain areas, for example, the central area of the back-plate 121f. As discussed, the protrusions or spacers 131 provide one means for preventing the back-plate from directly contacting the MEMS array 111. Also, the protrusions or spacers 131 provide one means for distributing forces applied to the back-plate and/or one means for minimizing or preventing damage to the MEMS array.

Figure 24:
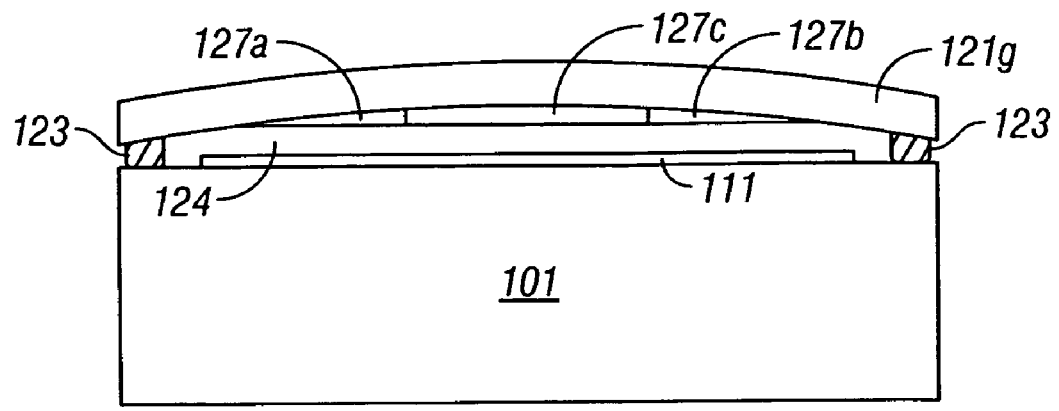

Referring to FIG. 24, the shape of the back-plate 121g is slightly different from those of the back-plates 121 and 121a-121f. The back-plate 121g is thinner in the central area than the peripheral areas 130 thereof. This shape is combined with the reinforcing structures 127a, 127b and 127c. Although the back-plate 121g itself may be more compliant in the central area than the peripheral areas, the reinforcing structures 127a and 127b add stiffness to the back-plate 121g, and can prevent the back-plate 121g from easily bending toward the MEMS array 111. Any other forms of the reinforcing structures may be used in this construction of the back-plate 121g. Also, the protrusions or spacers 131 illustrated in FIGS. 22 and 23 may be added to this construction.

Figure 25:
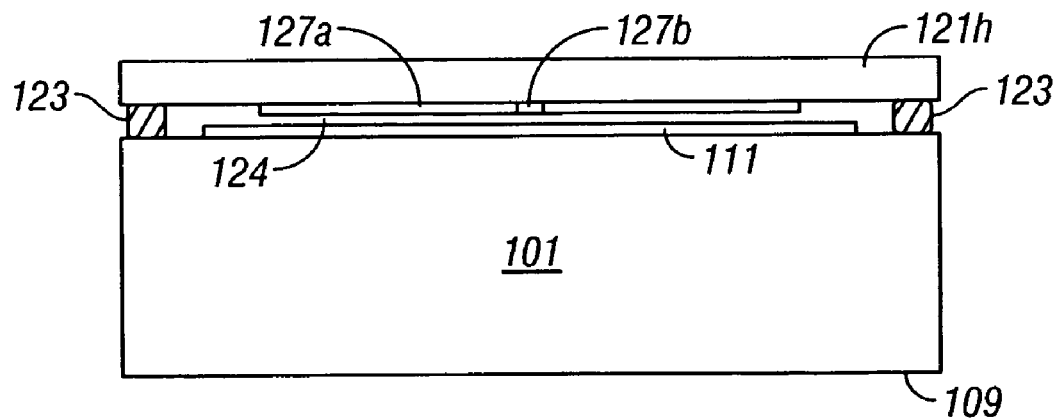

FIG. 25 illustrates a MEMS device with a substantially planar back-plate 121h with reinforcing structures 127a and 127b integrated thereto. The back-plate 121h without the reinforcing structures 127a and 127b has a thickness that is substantially the same throughout. In this embodiment, the depth of the gap 124 in the central area of the back-plate 121h may be smaller than the peripheral areas due to the thickness of the reinforcing structures 127a and 127b. However, the reinforcing structures 127a and 127b add stiffness to the back-plate 121g, and can prevent the back-plate 121g from contacting the MEMS array 111. The back-plate 121h can also have a lip protrusion 125 as shown in FIG. 9. Any other forms of the reinforcing structures may be used in this construction of the back-plate 121h. Also, the protrusions or spacers 131 illustrated in FIGS. 22 and 23 may be added to this construction.

The reinforcing structures and/or spacers of the back-plate 121c, 121d, 121e, 121f, 121g or 121h may be formed on an intermediate structure for the back-plate. In one embodiment, for example, the intermediate structure comprises a back-plate which does not have any reinforcing structures formed thereon. Attaching reinforcing structures on a surface of the intermediate back-plate 121a produces the back-plate 121c, 121d, 121e, 121f or 121g. In the curved back-plate constructions, the reinforcing structures may be attached onto a substantially flat panel or sheet prior to bending it or after bending. Alternatively, the reinforcing structures and/or spacers can be produced as part of the manufacturing process of the back-plate 121c, 121d, 121e, 121f, 121g or 121h. In an embodiment, for example, a blank is machined to remove some material in some regions while leaving the material elsewhere, thereby producing the back-plates with the reinforcing structures and/or spacers. In still another embodiment, for example, the back-plate with the reinforcing structures and/or spacers is produced by molding or forming. One of ordinary skill in the art will appreciate appropriate methods available for producing the back-plate, reinforcing structures and/or spacers. The methods of producing reinforcing structures and spacers can be used in the methods of producing the lip protrusion 125, and vice versa.

The materials for use in the foregoing reinforcing structures are, for example, polymers, glass, ceramics, metals, oxides of metallic or semiconductor materials, spin-on-glasses, frits, photo-patternable polymers, polymers containing desiccants, etc. The reinforcing structures may be made of the same material for the back-plate 121, 121a or 121b, on which the reinforcing structures are formed. The materials for the protrusions are, for example, polymers, glass, ceramics, metals, oxides of metallic or semiconductor materials, spin-on-glasses, frits, photo-patternable polymers, polymers containing desiccants, etc. Preferably, the reinforcing structures are made of the same material for the reinforcing structures 127a, 127b and/or 121c on which the protrusions are formed.

The reinforcing structures and the protrusions may be formed of one or more desiccants solely or in combination with one or more structural materials such as polymers. Forming the reinforcing structures with desiccant will eliminate or at least reduce the need for an extra space and/or a container for a desiccant within the package of the display, which requires humidity control to insure the proper operation of the MEMS mechanisms. Any of the desiccants described above can be used. Preferably, applicable desiccants are, for example, molecular sieves including aluminum complexes, calcium oxides, zeolites and carbon nano-tubes. One of ordinary skill in the art will appreciate the kinds and amounts of structural materials in case desiccants are selected for use in the reinforcing structures and/or protrusions.

Figure 26:
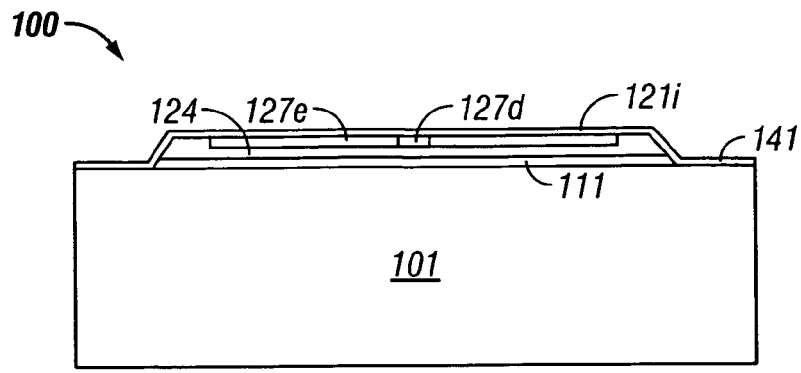

FIG. 26 illustrates a MEMS device with a thin film back-plate 121i with reinforcing structures 127d and 127e integrated thereto. In one embodiment, the thin film back-plate 121i has a thickness from about 10 μm to about 100 μm. The illustrated embodiment is configured similar to the embodiment illustrated in FIG. 25 except that the peripheral portions 141 of thin film back-plate 121i are directly deposited (without a seal 123) on the surface of the substrate 101 where the MEMS array 111 is not formed. Although not illustrated, one or more intervening layers may be sandwiched between the peripheral portions 141 of the thin film back-plate 121i and the substrate 101. In the illustrated embodiment, the peripheral portions 141 are preferably integrally deposited with the central portion of the back-plate 121i. The reinforcing structures 127d and 127e may be in various shapes. Although not illustrated, the protrusions 131 illustrated in FIGS. 22 and 23 may be added to this construction.

Figure 27:
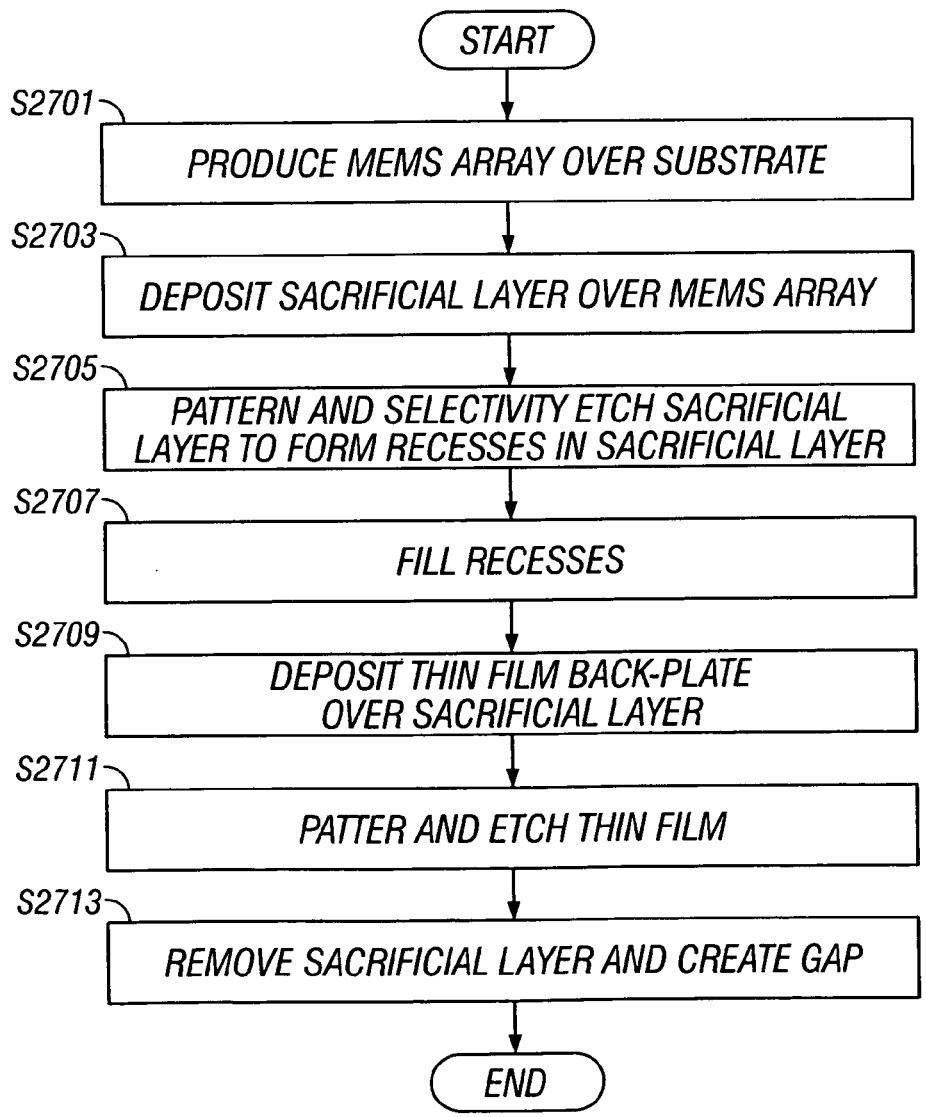
FIG. 27 is a flowchart describing an exemplary process to produce the embodiments illustrated in FIG. 26.

The embodiment of FIG. 26 is further described with reference to an exemplary process flowchart of FIG. 27. Depending on embodiments, additional steps may be added and/or some of the existing steps may be removed while the remaining steps are unchanged. In step S2701, the MEMS array 111 is fabricated on the substrate 101. Next at step S2703, a sacrificial layer (not shown) is formed over the MEMS array 111. The sacrificial layer may be formed of a material, such as, for example, molybdenum (Mo), silicon (Si), tungsten (W), or titanium (Ti), which is capable of being released later. In an embodiment, the sacrificial layer is formed of a material, such as a polymer, spin-on glass, or oxide. The skilled artisan will appreciate that the sacrificial layer can be deposited to the desired thickness. The thickness of the sacrificial layer should be sufficient to separate the thin film back-plate 121i and the MEMS array 111. In one embodiment, the sacrificial layer is deposited to a thickness in the range of about 1000 Å to 10 μm, and more preferably in a range of about 1000 Å to 1 μm.

Proceeding to step S2705, the sacrificial layer is patterned and selectively etched away to form recesses (not shown) using photolithographic techniques. The recesses formed in the sacrificial layer are used as a negative to make the reinforcing structures 127d and 127e therein. The recesses are formed in the depth and shape sufficient to create the reinforcing structures 127d and 127e. Then, in step S2707, the recesses are filled with a material to form the reinforcing structures 127d and 127e. The reinforcing structures 127d and 127e may be any type of materials including, not limited to, semiconductors, metals, alloys, polymers or plastics and composite materials. Continuing to the step S2709, then a thin film back-plate 121i is deposited over the entire structure including the substrate 101, the sacrificial layer and the recesses filled with the material for the reinforcing structures 127d and 127e. In some embodiments, the thin film back-plate 121i may be any type of material that is impermeable or hydrophobic, including, but not limited to, nickel, aluminum, and other types of metals and foils. The thin film may also be formed of an insulator, including, but not limited to, silicon dioxide, aluminum oxide, or nitrides. Alternatively, the thin film may be formed of a permeable material. Suitable permeable materials include polymers, such as, for example, PMMA, epoxies, and organic or inorganic spin-on glass (SOG) type materials. In some embodiments, the thin film back-plate 121i and the reinforcing structures 127d and 127e may be formed of the same material.

Next at step S2711, the thin film back-plate 121i is patterned and etched to form at least one opening through the back-plate 121i. The thin film back-plate 121i may be further patterned and processed to allow electrical connections and contacts to the MEMS array 111 and other parts of the device. Continuing to step S2713, the sacrificial layer located between the MEMS array 111 and the back-plate 121i and/or the reinforcing structures 127d and 127e is selectively removed. The gap 124 is formed where the sacrificial layer is removed. An etchant is supplied via the opening formed in the thin film back-plate 121i. As the etchant contacts and reacts with the exposed area of the sacrificial layer, the sacrificial layer material is selectively etched away. For example, to remove a sacrificial layer of molybdenum (Mo), silicon (Si), tungsten (W), or titanium (Ti), xenon diflouride ($XeF_2$) may be introduced into the interior of the MEMS device through the at least one opening. After the sacrificial layer is removed and the gap 124 is created, the opening in the thin film back-plate 121i is sealed. One of ordinary skill in the art in the field of semiconductor processing or photolithography will appreciate the process described herein and determine appropriate parameters to produce the back-plate 121i with the reinforcing structures 127d and 127e.

In the foregoing embodiments, particularly those of FIGS. 16-26, the reinforcing structures and the interior surface of the back-plate form pockets or recesses. The pocket or recess areas are defined by the walls or surfaces of the reinforcing structures formed on the back-plate. In some embodiments, part or all of the pockets or recesses are filled with one or more desiccants that can absorb water molecules contained within the display device. The desiccants contained in the pocket or recess areas further reinforce the structural strength and stiffness of the back-plate. The embodiments of FIGS. 12-15 may also accommodate a desiccant by forming a layer of the desiccant on the interior surface 129 of the back-plate 121a, 121b (not illustrated). Alternatively, a container for containing a desiccant may be formed on the interior surface of the back-plate.

It is to be understood that persons of skill in the appropriate arts may modify the invention here described while still achieving the favorable results of this invention. Accordingly, the foregoing description is to be understood as being a broad, teaching disclosure directed to persons of skill in the appropriate arts, and not as limiting upon the invention.

What is claimed is:

1. An electronic device, comprising:
   a substrate;
   an array of microelectromechanical devices formed on the substrate, the array having a back-surface facing away from the substrate;
   a back-plate placed over the array and having an interior surface and an exterior surface, the interior surface facing the back-surface of the array with a gap therebetween, the exterior surface facing away from the substrate; and
   one or more reinforcing structures integrated with the back-plate, wherein the one or more reinforcing structures do not contact the substrate while the back-plate and substrate are sealed along peripheries thereof.

2. The electronic device of claim 1, wherein the reinforcing structures increases stiffness of the back-plate.

3. The electronic device of claim 1, wherein a distance between the interior surface and the substrate changes over the interior surface.

4. The electronic device of claim 3, wherein the interior surface comprises a central area and a peripheral area, and wherein the distance is generally greater in the central area than in the peripheral area.

5. The electronic device of claim 1, wherein the back-plate has a varying thickness.

6. The electronic device of claim 1, wherein the back-plate is bowed away from the array.

7. The electronic device of claim 1, wherein the one or more reinforcing structures are formed on at least one of the interior surface and the exterior surface of the back-plate.

8. The electronic device of claim 1, wherein the interior surface comprises a central area and a peripheral area, and wherein the one or more reinforcing structures are formed more densely in the central area than the peripheral area.

9. The electronic device of claim 1, wherein the one or more reinforcing structures comprise at least one interconnecting structure interconnecting two or more reinforcing structures.

10. The electronic device of claim 9, wherein the at least one interconnecting structure further adds stiffness to the back-plate.

11. The electronic device of claim 1, further comprising one or more spacers provided in the gap, wherein the one or more members prevent the back-plate from directly contacting the back-surface of the array.

12. The electronic device of claim 11, wherein the one or more spacers are formed on the interior surface or on the back-surface of the array.

13. The electronic device of claim 1, further comprises a seal sandwiched between the substrate and the back-plate along edges of the interior surface.

14. The electronic device of claim 1, wherein the back-plate comprises a protrusion extending toward the substrate along an edge of the back-plate.

15. The electronic device of claim 1, wherein the back-plate comprises a periphery along edges thereof, and wherein the periphery of the back-plate is directly formed on the substrate.

16. The electronic device of claim 1, wherein the array comprises a display array.

17. The electronic device of claim 1, wherein the one or more reinforcing structures are made of a material comprising the back-plate.

18. The electronic device of claim 1, wherein the one or more reinforcing structures are made of a material comprising a desiccant.

19. An electronic device, comprising:
a substrate;
an array of interferometric modulators formed on the substrate, the array having a back-surface facing away from the substrate;
a back-plate placed over the array and having an interior surface facing the back-surface of the array with a gap between the interior surface and the back-surface of the array; and
means for preventing the interior surface from directly contacting the back-surface of the array, wherein the preventing means does not contact the substrate while the back-plate and substrate are sealed alone peripheries thereof.

20. The electronic device of claim 19, wherein the preventing means comprises means for adding stiffness of the back-plate.

21. The electronic device of claim 19, wherein the preventing means comprises stops placed in the gap.

22. The electronic device of claim 19, wherein the preventing means comprises varying thickness of the back-plate.

23. The electronic device of claim 19, wherein the preventing means comprises a reinforcing structure formed on the back-plate.

24. A method of making an electronic device, comprising:
providing an intermediate device comprising a substrate and an array of microelectromechanical devices formed on the substrate, the array having a back-surface facing away from the substrate; and
forming a back-plate over the array of the intermediate device, the back-plate having an interior surface and an exterior surface, the interior surface facing the back-surface of the array with a gap therebetween, the back-plate being integrated with one or more reinforcing structures formed on at least one of the interior surface and the exterior surface, wherein the one or more reinforcing structures do not contact or attached to the substrate while the back-plate and substrate are sealed along peripheries thereof.

25. The method of claim 24, wherein forming the back-plate further comprises:
placing the back-plate over the array of the intermediate device; and
binding the back-plate with the substrate along a periphery of the back-plate.

26. The method of claim 24, wherein forming the back-plate further comprises:
forming a sacrificial layer over the array of the intermediate device;
selectively etching the sacrificial layer so as to form one or more recesses;
thereafter depositing a back-plate layer over the sacrificial layer; and
removing the sacrificial layer so as to form a gap between the array and the back-plate layer.

27. The method of claim 26, further comprising filling the one or more recesses with a material prior to depositing the back-plate layer.

28. An electronic device produced by a method comprising:
providing an intermediate device comprising a substrate and an array of microelectromechanical devices formed on the substrate, the array having a back-surface facing away from the substrate; and
forming a back-plate over the array of the intermediate device, the back-plate having an interior surface and an exterior surface, the interior surface facing the back-surface of the array with a gap therebetween, the back-plate being integrated with one or more reinforcing structures formed on at least one of the interior surface and the exterior surface, wherein the one or more reinforcing structures do not contact or attached to the substrate while the back-plate and substrate are sealed along peripheries thereof.

29. The electronic device of claim 28, wherein a distance between the back-plate and the substrate changes over the interior surface.

30. The electronic device of claim 28, wherein the interior surface comprises a central area and a peripheral area, and wherein the distance is greater in the central area than in the peripheral area.

* * * * *

UNITED STATES PATENT AND TRADEMARK OFFICE
CERTIFICATE OF CORRECTION

PATENT NO. : 7,405,924 B2  Page 1 of 1
APPLICATION NO. : 11/090774
DATED : July 29, 2008
INVENTOR(S) : Brian Gally, Lauren Palmateer and William J. Cummings It is certified that error appears in the above-identified patent and that said Letters Patent is hereby corrected as shown below:

Column 14, line 48, delete "12 1d." and insert -- 121d. --

Column 18, line 9, delete "diflouride" and insert -- difluoride --

Column 19, line 53, in Claim 19, delete "alone" and insert -- along --

Signed and Sealed this

Seventeenth Day of February, 2009

JOHN DOLL
*Acting Director of the United States Patent and Trademark Office*